US008442789B2

(12) United States Patent　　　(10) Patent No.: US 8,442,789 B2
Eckert et al.　　　(45) Date of Patent: May 14, 2013

(54) METHOD AND DEVICE FOR DETERMINING A FREQUENCY MASK FOR A FREQUENCY SPECTRUM

(75) Inventors: Hagen Eckert, Mering (DE); Jochen Pliquett, Munich (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 338 days.

(21) Appl. No.: 12/967,881

(22) Filed: Dec. 14, 2010

(65) Prior Publication Data

US 2011/0153247 A1　　Jun. 23, 2011

(30) Foreign Application Priority Data

Dec. 17, 2009　(DE) .......................... 10 2009 058 741
May 18, 2010　(DE) .......................... 10 2010 020 910

(51) Int. Cl.
　　*G01R 23/16*　　(2006.01)
　　*G06F 19/00*　　(2011.01)
(52) U.S. Cl.
　　USPC .......................................................... 702/76
(58) Field of Classification Search ............ 702/76, 702/75; 375/224, 268
See application file for complete search history.

(56) References Cited

U.S. PATENT DOCUMENTS

| 7,159,187 | B2 | 1/2007 | Bernard et al. |
| 2006/0025947 | A1 | 2/2006 | Earls |
| 2011/0046948 | A1* | 2/2011 | Pedersen ...................... 704/231 |

FOREIGN PATENT DOCUMENTS

| EP | 1089079 A2 | 4/2001 |
| EP | 2071341 A2 | 6/2009 |

* cited by examiner

*Primary Examiner* — Bryan Bui
(74) *Attorney, Agent, or Firm* — Marshall, Gerstein & Borun LLP

(57) ABSTRACT

A method and a device for determining a frequency mask disposed above or below a frequency spectrum of a detected signal determines every individual ordinate value of a first envelope curve disposed completely above or below the frequency spectrum as the maximum value or minimum value of a given number of respectively adjacent ordinate values of the frequency spectrum linked to a window function. Following this, each individual ordinate value of a second envelope curve disposed completely above or below the frequency spectrum and completely above or below the first envelope curve is determined as the maximum value or minimum value of a given number of respectively adjacent ordinate values of the frequency spectrum linked to a window function. Finally, a minimum number of ordinate values of the frequency mask from ordinate values of the first and/or second envelope curve disposed completely between the first and second envelope curve is determined, wherein in each case two successive ordinate values of the frequency mask with a maximum horizontal spacing distance within the first and second envelope curve can be reached in a linear manner relative to one another.

39 Claims, 16 Drawing Sheets

Legend:

Points: ordinate values of the frequency spectrum

Squares: ordinate values of the frequency mask

Line with squares: approximation function with selected ordinate values

Line with triangles: horizontal at maximum

Line with circles: horinzontal at maximum - 1dB

Line with crosses: horinzontal at maximum - 3dB

US 8,442,789 B2

METHOD AND DEVICE FOR DETERMINING A FREQUENCY MASK FOR A FREQUENCY SPECTRUM

CROSS-REFERENCE TO RELATED APPLICATIONS

Convention priority of German patent applications DE 10 2009 058 741.1 filed Dec. 17, 2009, and DE 10 2010 020 910.4 filed May 18, 2010, the entire respective disclosures of which are incorporated herein by reference, are claimed.

BACKGROUND OF THE INVENTION

1. Field of the Invention

The invention relates to a method and a device for determining a frequency mask for a frequency spectrum.

2. Related Technology

In the analysis of the frequency spectrum of a signal to be detected using a spectrum analyzer, frequency masks are used. In this context, an upper and lower frequency mask is defined, which marks the validity region of the frequency spectrum to be analyzed. If the frequency spectrum is disposed completely within the upper and lower frequency mask, a valid frequency spectrum is accordingly available. By contrast, if the frequency spectrum is disposed at least partially outside the upper and/or lower frequency mask, the spectrum analyzer initiates a triggering or a data collection or a marking of the recorded data record followed by a display of the invalid frequency region at a detection time or over a detection time interval on the display. Additionally, in a case of an invalidity, the spectrum analyzer can also issue a warning, for example, an error message or an acoustic signal.

The upper and lower frequency mask is entered manually by the user of the spectrum analyzer through a graphic entry of the curve characteristics of the upper and lower frequency mask or through an alphanumeric entry of curve-characteristic values of the upper and lower frequency mask on a graphic or alphanumeric user surface of the spectrum analyzer. In the case of a semiautomatic entry, the user of the spectrum analyzer is shown a menu with a given number of parametrisable curve characteristics for the upper and lower frequency mask for selection and subsequent parametrisation. With a fully automatic generation of the frequency mask, an upper and/or lower frequency mask suitable for the analysis of the frequency spectrum is determined by the spectrum analyzer without the involvement of the user starting from the detected frequency spectrum.

An automatic generation of a frequency mask of this kind for a detected frequency spectrum is known from EP 2 071 341 A2. For this purpose, the detected frequency spectrum is displaced in both frequency directions in each case by a given frequency value. If the two frequency spectra displaced respectively by a given frequency value in positive and negative frequency directions are connected to one another horizontally at the respective dividing points and displaced vertically upwardly and/or downwardly by multiplication in each case by an appropriate amplification factor, an upper and/or lower frequency mask that is distanced from the detected frequency spectrum in the horizontal and also in the vertical direction is obtained. The frequency value by which the detected frequency spectrum is displaced in the horizontal direction, and the amplification factor, by which the horizontally displaced frequency spectrum is displaced vertically can be predetermined by the user and determine the size of the tolerance band between the detected frequency spectrum and the upper and lower frequency mask.

While a frequency mask for a frequency spectrum with singular and clearly distanced spectral components which approximates the frequency spectrum relatively well within a given tolerance distance is generated according to this prior art, the known method fails with a frequency spectrum with closely adjacent spectral turning points in the spectral characteristic, that is to say, with turning points in the spectral characteristic which are disposed within the frequency value by which the original frequency spectrum is displaced in the horizontal direction.

SUMMARY OF THE INVENTION

The invention provides a method and a device for the automatic generation of a frequency mask to display a frequency mask approximating the frequency spectrum well and in a user-friendly manner especially for a frequency spectrum with spectrally closely adjacent turning points in the spectral characteristic.

The object of the invention is achieved by a method for determining a frequency mask disposed above or below a frequency spectrum of a detected signal and by a device for determining a frequency mask disposed above or below a frequency spectrum of a detected signal.

In a first method according to the invention and a first device according to the invention, a first envelope curve disposed completely above or below the detected frequency spectrum is determined by determining every ordinate value of the first envelope curve as a maximum value or a minimum value of a given number of ordinate values of the detected frequency spectrum adjacent to the respective ordinate value of the first envelope curve and linked to a window function.

As a result of the determination according to the invention of every ordinate value of the first envelope curve as a maximum or minimum value from the respectively adjacent ordinate values of the frequency spectrum, a smoothing of the characteristic of the first envelope curve is implemented on the maximum or minimum ordinate value of the frequency spectrum disposed respectively within an environment. In this manner, fluctuations of the spectral characteristic, and accordingly, turning points within adjacent ordinate values of the frequency spectrum do not have a negative influence on the characteristic of the first envelope curve. The linking of the respectively adjacent ordinate values of the frequency spectrum to a window function weights the influence of the individual ordinate values of the frequency spectrum on the ordinate value of the first envelope curve to be determined in each case, wherein, in the case of a window function with a maximum or a minimum ordinate value of the frequency spectrum with a relatively larger distance from the ordinate value of the first envelope curve to be determined exerts an increasingly smaller influence on the ordinate value of the first envelope curve to be determined in each case. Additionally, through an appropriate selection of the window type of the window function, an improved approximation of the characteristic of the registered frequency spectrum can be achieved through the characteristic of the first envelope curve.

Additionally, according to the invention, a second envelope curve may be determined, which is disposed, in the case of a frequency mask to be determined above the frequency spectrum, completely above the detected frequency spectrum and at the same time above the first envelope curve, and is disposed, in the case of a frequency mask to be determined below the frequency spectrum, completely below the detected frequency spectrum and at the same time below the first envelope curve. For this purpose, in an equivalent manner to the determination of the first envelope curve, every ordinate value of the second envelope curve, in the case of a frequency mask to be determined above the frequency spectrum, is determined as a maximum value and, in the case of a frequency mask to be determined below the frequency spectrum, as a minimum value of a given number of ordinate values of the detected frequency spectrum adjacent to the respective ordinate value of the second envelope curve and linked to a window function.

By determining a first and second envelope curve above or below the detected frequency spectrum, a corridor is created in each case in which those ordinate values of the upper or lower frequency mask are completely disposed which provide a reduced number of ordinate values by comparison with the number of ordinate values of the respective first and second envelope curve.

The ordinate values of the upper or lower frequency mask preferably are determined by selecting those ordinate values of the respective first and/or second envelope curve which each provide a maximum horizontal spacing distance relative to one another and can be connected in each case completely within the first and second envelope curve in a linear manner. In this manner, a minimum number of ordinate values can be achieved for the upper or lower frequency mask by comparison with the number of ordinate values of the first and second envelope curve.

A given window type, for example, parabolic, Gaussian or rectangular, preferably is allocated to the window function to which respectively adjacent ordinate values of the detected frequency spectrum are linked.

To obtain different characteristics between the first and second envelope curve, the respectively adjacent ordinate values of the detected frequency spectrum preferably are linked to a window function of which the window type and/or width and/or height (amplitude) are different.

If the ordinate values of the detected frequency spectrum are linear values, the linking between the respectively adjacent ordinate values of the detected frequency spectrum and the ordinate values of the window function preferably is implemented through a multiplicative weighting.

By contrast, if the ordinate values of the detected frequency spectrum are logarithmic values, the linking between the respectively adjacent ordinate values of the detected frequency spectrum and the ordinate values of the window function preferably is implemented through an additive linking.

The vertical position of the first and second envelope curve and accordingly the vertical position of the upper or lower frequency mask relative to the vertical position of the detected frequency spectrum preferably is determined by weighting of the ordinate values of the first and second envelope curve with a weighting factor which can be selected by the user.

Moreover, a noise carpet disposed within the detected frequency spectrum preferably is approximated by ordinate values that are disposed on a horizontal straight line and distanced by a weighting factor, for example, at the level of 3 dB preferably from the minimum of the determined first upper envelope curve.

In a second method according to the invention and a second device according to the invention, a minimum number of ordinate values is determined for an upper or lower frequency mask by selecting either the ordinate value of the frequency spectrum disposed at the left or right end of the detected frequency spectrum as the first ordinate value of the frequency mask and, in each case, successively selecting the ordinate value of the frequency spectrum which provides the furthest horizontal spacing distance in each case relative to the last determined ordinate value of the frequency mask as the next ordinate value of the frequency mask, wherein all ordinate values of the detected frequency spectrum between the current and the last-determined ordinate value of the frequency mask provide a vertical spacing distance relative to a connecting line between the current and the last-determined ordinate value of the frequency mask, which is smaller than a specified threshold value. If a minimum number of ordinate values for a frequency mask is determined in this manner, the ordinate values of the upper and the lower frequency mask are determined respectively by weighting the ordinate values of the frequency mask in each case with an appropriate weighting factor.

The second method according to the invention and the second device according to the invention also allow the determination of a minimum number of ordinate values for an upper or lower frequency mask, in that the minimality of the number of ordinate values is achieved by determining the maximum possible horizontal distances between the selected ordinate values, while at the same time avoiding excessively large vertical spacing distances of the ordinate values of the originally detected frequency spectrum positioned in between and not selected.

Additionally, the ordinate values of the upper or lower frequency mask determined by the first or second method according to the invention and by the first or second device according to the invention preferably are optimized in the three substantial regions of maxima or minima of the frequency mask, transition between a noise floor and a frequency region of the frequency mask directly adjacent to the noise floor and edges of the frequency mask.

To optimize the ordinate values of the frequency mask in the environment of the maxima or the minima, in the first step, the frequency values and the associated ordinate values of the maxima or minima are typically identified by forming the second derivation and investigating the environment. Following this, all ordinate values of the frequency spectrum in the environment of the respective maximum or minimum preferably are determined by specifying a region between the respective maximum and a threshold value disposed below the respective maximum or between the respective minimum and a threshold value disposed above the respective minimum and determining all ordinate values of the determined frequency mask disposed therein. The function type, for example, parabola, and the function parameters associated with the function type of an approximation function that is supposed to optimize the determined frequency mask in the environment of the respective maximum or the respective minimum are then determined. For this purpose, a metric between the ordinate values of the determined frequency mask and the ordinate values of the approximation function to be determined in the environment of the maximum or minimum to be optimized in each case is minimized.

Finally, the approximation function determined by means of metric minimization is characterized and displayed through characteristic ordinate values, for example, ordinate value at the maximum, ordinate value at the maximum with the deduction of a first threshold value, ordinate value at the maximum with the deduction of a second threshold value, or ordinate value at the minimum, ordinate value at the minimum with the addition of a first threshold value, ordinate value at the minimum with the addition of a second threshold value in the case of a parabolic or Gaussian approximation function or ordinate values at the four corner points in the case of a trapeze-shaped approximation function.

In the metric minimization, it should preferably be taken into consideration as a marginal condition that the determined ordinate values of the approximation function in the environment of a maximum come to be disposed either above the ordinate values of the determined frequency mask or within a given tolerance band below the ordinate values of the determined frequency mask, and in the environment of a minimum either below the ordinate values of the determined frequency mask or within a given tolerance band above the ordinate values of the determined frequency mask.

As a further marginal condition for the metric minimization, it should preferably be taken into consideration that the determined ordinate values of the approximation function in the environment of a maximum come to be disposed above the ordinate values of the second envelope curve and must come to be disposed below the ordinate values of the second envelope curve in the environment of a minimum.

For the optimization of the ordinate values of the frequency mask in the transitional region between a noise floor and a frequency region of the frequency mask adjacent to the noise floor, a metric preferably is calculated in a first step from the linear interpolated ordinate values of the determined frequency mask and the ordinate values of the original frequency spectrum in the transitional region. Following this, in the case of a noise floor disposed in the transitional region on the left side, the linear interpolated ordinate values of the determined frequency mask are displaced towards the left, in each case successively by one sampled-frequency value and, in each case a metric between the linear interpolated ordinate values displaced respectively by one sampled-frequency value towards the left of the determined frequency mask and the ordinate values of the original frequency spectrum is calculated successively until the respectively calculated metric is minimal.

With a minimal metric, an ordinate value of the displaced frequency mask is disposed at the first ordinate value of the noise floor in the frequency spectrum disposed at the transitional point. The linear interpolated ordinate values last displaced by one sampled-frequency value of the upper or lower frequency mask represent the optimized ordinate values of the upper or lower frequency mask in the transitional region between the noise floor and a frequency region of the upper or lower frequency mask adjacent to the noise floor.

In the case of a noise floor disposed in the transitional region on the right side, the linear interpolated ordinate values of the determined frequency mask preferably are displaced in a corresponding manner successively towards the right, in each case by one sampled-frequency value and, in each case a metric is calculated successively between the linear interpolated ordinate values of the determined frequency mask displaced respectively by one sampled-frequency value towards the right and the ordinate values of the original frequency spectrum.

In the optimization of the frequency mask in the region of the edges, the number of ordinate values of the upper or lower frequency mask preferably is optimized using the first or second method according to the invention and using the first or second device according to the invention, wherein the use of the first and second method according to the invention is restricted to the corresponding edge regions.

Spectral values or alternatively power values can be used as ordinate values of the detected frequency spectrum, of the determined upper or lower frequency mask, the first and second envelope curves and the optimized approximation function for the upper or lower frequency mask.

BRIEF DESCRIPTION OF THE DRAWINGS

In the following section, exemplary embodiments of the method according to the invention and the device according to the invention for determining a frequency mask for a frequency spectrum will be explained in detail by way of example with reference to the drawings. The drawings are as follows.

DETAILED DESCRIPTION

Figure 12A:
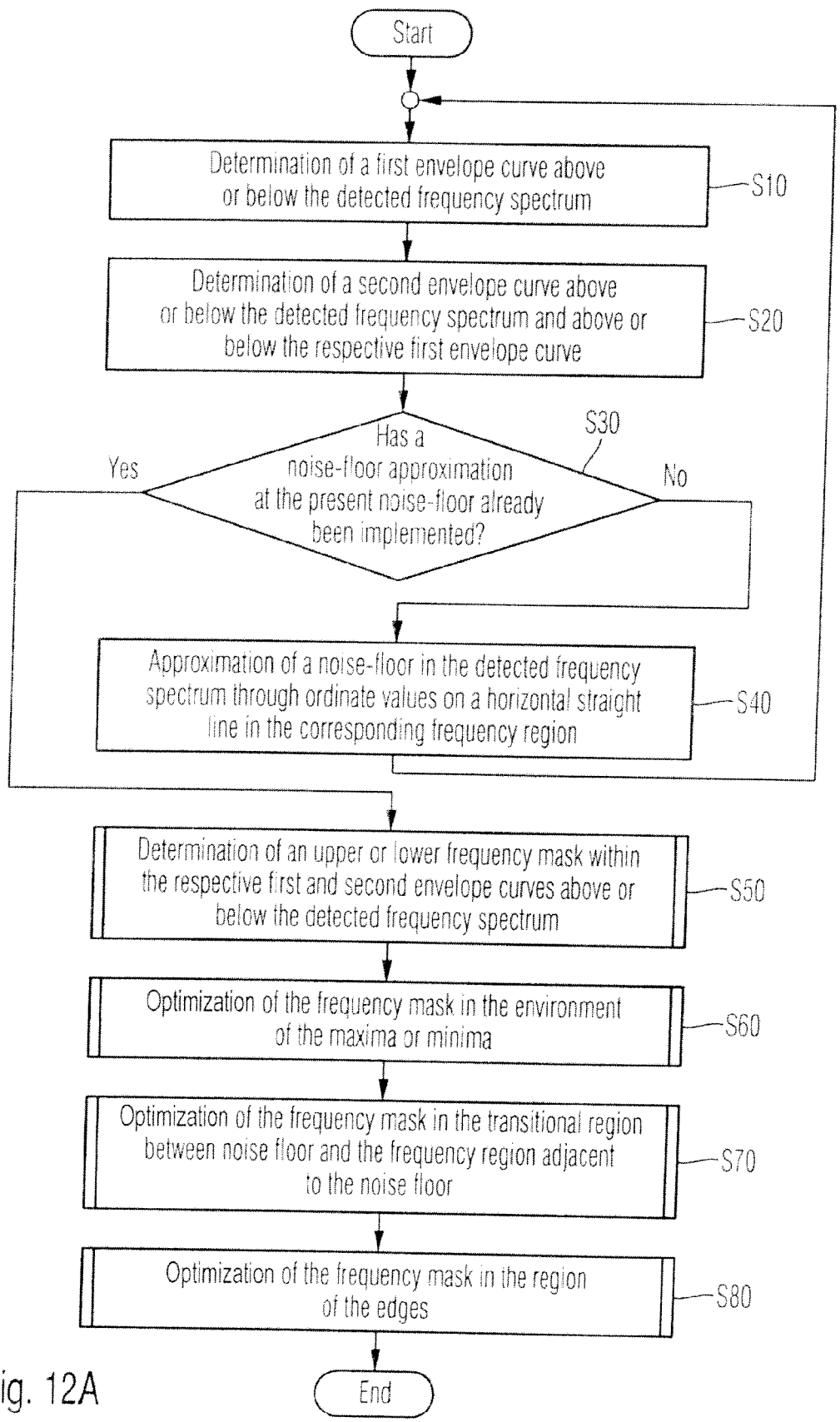
FIG. 12A shows a flow chart of the first exemplary embodiment of the method according to the invention for determining a frequency mask for a frequency spectrum.
Figure 15A:
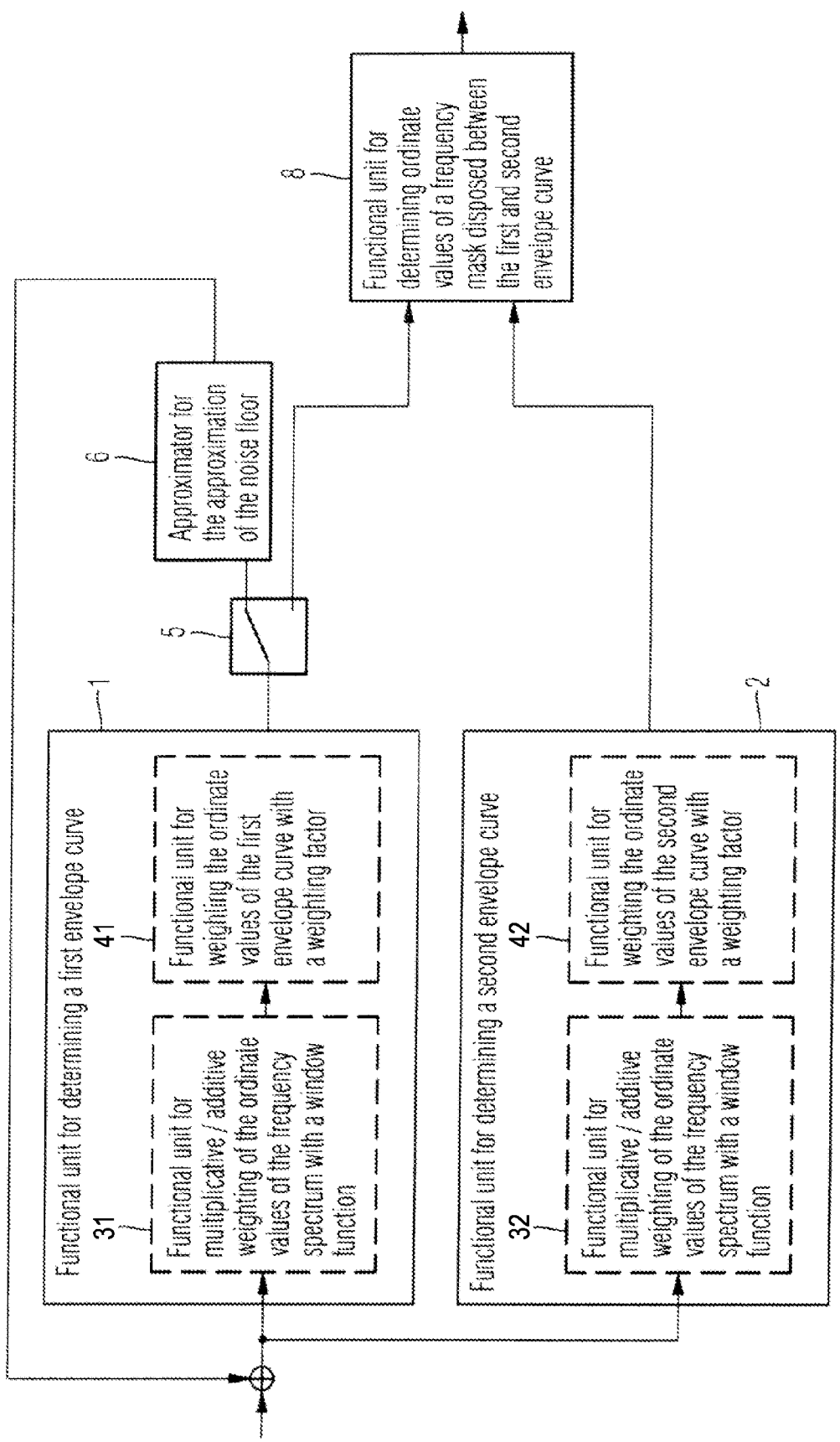
FIG. 15A shows a block diagram of a first exemplary embodiment of the device according to the invention for determining a frequency mask for a frequency spectrum.

In the following section, the first exemplary embodiment of the method according to the invention for determining a frequency mask for a frequency spectrum is explained on the basis of the flow chart in FIG. 12A, and the associated first exemplary embodiment of the device according to the invention for determining a frequency mask for a frequency spectrum is explained on the basis of the block diagram in FIG. 15A.

In the first method step S10, in a functional unit 1 for determining the first envelope curve starting from the ordinate values $S(n \cdot \Delta f)$ of the frequency spectrum of the detected signal $S(v \cdot \Delta T)$, which either present spectral level values or power values, the ordinate values $E(n \cdot \Delta f)$ of an upper and/or lower first envelope curve are generated.

For this purpose, in a functional unit 31 for the multiplicative or additive linking of the ordinate values of the frequency spectrum to a window function, each ordinate value of the frequency mask is determined as an extreme value of a given number $2 \cdot m+1$ of respectively adjacent ordinate values of the frequency spectrum, which are each weighted with a given window function.

To determine an upper, first envelope curve in the case of linear ordinate values in this context, each ordinate value $E_{Lin,U1}(n)$ of the upper, first envelope curve is determined according to equation (1A) as a maximum value from a given number $2 \cdot m+1$ of respectively adjacent ordinate values $S_{Lin}(n)$ of the frequency spectrum, which are each weighted with a given a window function $w_{Lin}(n)$.

$$E_{Lin,U1}(n)=\max\{S_{Lin}(n-m) \cdot w_{Lin}(1), S_{Lin}(n-(m-1)) \cdot w_{Lin}(2), \ldots, S_{Lin}(n+(m)) \cdot w_{Lin}(2 \cdot m+1)\} \cdot y_{Lin,U1} \quad (1A)$$

In a subsequent functional unit 41 for weighting the determined ordinate values of the first envelope curve with a weighting factor, the determined maximum value is weighted multiplicatively with a weighting factor $y_{Lin,U1}$, to displace the ordinate values $E_{Lin,U1}(n)$ of the upper, first envelope curve to an appropriate vertical position relative to the vertical position of the ordinate values of the frequency spectrum.

In the presence of logarithmic ordinate values, each individual ordinate value $E_{Log,U1}(n)$ of the upper, first envelope curve is obtained according to equation (2A) as a maximum value from a given number $2 \cdot m+1$ of respectively adjacent ordinate values $S_{Log}(n)$ of the logarithmic frequency spectrum, which are each linked additively to a given a window function $w_{Log}(n)$. Finally, the determined maximum value is linked additively to a weighting factor $y_{Log,U1}$, to displace the ordinate values $E_{Log,U1}(n)$ of the upper, first envelope curve to an appropriate vertical position relative to the vertical position of the ordinate values of the frequency spectrum.

$$E_{Log,U1}(n)=\max\{S_{Log}(n-m)+w_{Log}(1), S_{Log}(n-(m-1))+w_{Log}(2), \ldots, S_{Log}(n+(m)) \cdot w_{Log}(2 \cdot m+1)\} \cdot y_{Log,U1} \quad (2A)$$

In the presence of linear ordinate values, the ordinate values $E_{Lin,D1}(n)$ of the lower, first envelope curve are obtained according to equation (1B) as a minimum value from a given number $2 \cdot m+1$ of respectively adjacent ordinate values $S_{Lin}(n)$ of the frequency spectrum, which are each weighted with a given window function $w_{Lin}(n)$, and, in the presence of logarithmic ordinate values, the ordinate values $E_{Log,D1}(n)$ of the lower first envelope curve are obtained according to equation (2B) as a minimum value from a given number $2 \cdot m+1$ of respectively adjacent ordinate values $S_{Log}(n)$ of the frequency spectrum, which are each weighted with a given window function $w_{Log}(n)$. The vertical displacement of the minimum value is implemented in the case of linear ordinate values through multiplicative weighting with the weighting factor $y_{Lin,D1}$ in the case of logarithmic ordinate values through additive linking with the weighting factor $y_{Log,D1}$.

$$E_{Lin,D1}(n)=\min\{S_{Lin}(n-m) \cdot w_{Lin}(1), S_{Lin}(n-(m-1)) \cdot w_{Lin}(2), \ldots, S_{Lin}(n+(m)) \cdot w_{Lin}(2 \cdot m+1)\} \cdot y_{Lin,D1} \quad (1B)$$

$$E_{Log,D1}(n)=\max\{S_{Log}(n-m)+w_{Log}(1), S_{Log}(n-(m-1))+w_{Log}(2), \ldots, S_{Log}(n+(m)) \cdot w_{Log}(2 \cdot m+1)\} \cdot y_{Log,D1} \quad (2A)$$

Figure 1:
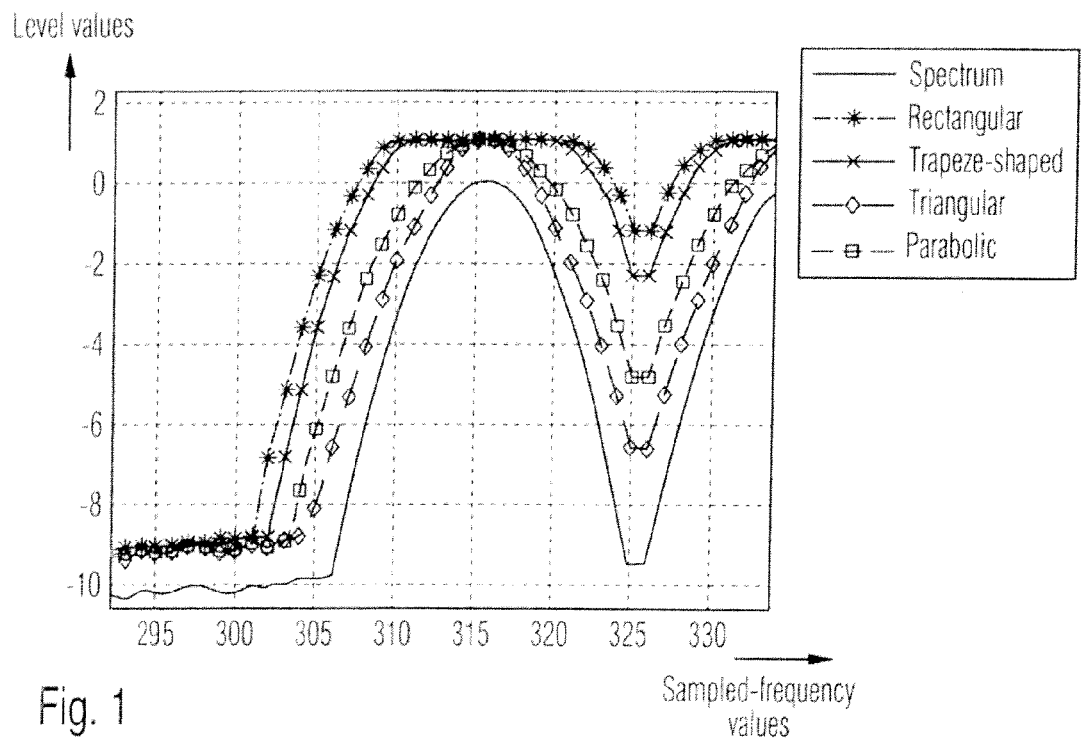
FIG. 1 shows a frequency diagram with several window functions for a specified frequency spectrum.

As shown in FIG. 1, all possible window types, for example rectangular, trapeze-shaped, triangular or parabolic window functions can be used as the window functions $w_{Lin}(n)$ and respectively $w_{Log}(n)$. An appropriate window type is selected dependent upon the course and the time characteristic of the frequency spectrum. For signals with a time-invariant carrier a narrow-band window function, for example, a parabolic window function, can typically be selected, while for signals with a time-variable carrier, broader-band window functions, for example, rectangular or trapeze-shaped window functions are appropriate.

In the next method step S20, the ordinate values $E_{Lin,U2}(n)$ and respectively $E_{Log,U2}(n)$ of the upper, second envelope curve are determined with reference to equation (1A) and respectively (2A), and the ordinate values $E_{Lin,D2}(n)$ and respectively $E_{Log,D2}(n)$ of the lower, second envelope curve are determined with reference to equation (1B) and respectively (2B) in a functional unit 32 for multiplicative or respectively additive weighting of ordinate values of the frequency spectrum with a window function, and in a subsequent functional unit 42 for weighting the ordinate values of the second envelope curve with a weighting factor of a functional unit 2 for determining a second envelope curve. In this context, by preference in accordance with equation (3A) and respectively (3B), all ordinate values $E_{Lin,U2}(n)$ and respectively $E_{Log,U2}(n)$ of the upper, second envelope curve should be greater than or equal to all ordinate values $E_{Lin,U1}(n)$ and respectively $E_{Log,U1}(n)$ of the upper, first envelope curve and, in accordance with equation (3C) and respectively (3D), all ordinate values $E_{Lin,D2}(n)$ and respectively $E_{Log,D2}(n)$ of the lower, second envelope curve should be smaller than or equal to all ordinate values $E_{Lin,D1}(n)$ and respectively $E_{Log,D1}(n)$ of the lower, first envelope curve.

$$E_{Lin,U2}(n) \geq E_{Lin,U1}(n) \quad (3A)$$

$$E_{Log,U2}(n) \geq E_{Log,U1}(n) \quad (3B)$$

$$E_{Lin,D1}(n) \geq E_{Lin,D2}(n) \quad (3C)$$

$$E_{Log,D1}(n) \geq E_{Log,D2}(n) \quad (3D)$$

To determine the ordinate values $E_{Lin,U2}(n)$ and respectively $E_{Log,U2}(n)$ or respectively $E_{Lin,D2}(n)$ and $E_{Log,D2}(n)$ of the second envelope curve, by comparison with the determination of the ordinate values in $E_{Lin,U1}(n)$ or $E_{Log,U1}(n)$ and $E_{Lin,D1}(n)$ or $E_{Log,D1}(n)$ of the first envelope curve, the user uses a different window type of the window function $w_{Lin}(n)$ and respectively $w_{Log}(n)$ and/or uses a different weighting factor $y_{Lin,U2}$ or respectively $y_{Log,U2}$ and respectively $y_{Lin,D2}$ or respectively $y_{Log,D2}$ in a functional unit 42 for weighting the ordinate values of the second envelope curve with a weighting factor.

In the next method step S30, the question is asked whether a noise floor approximation has already been implemented on the detected frequency spectrum at the present noise floor.

Figure 3:
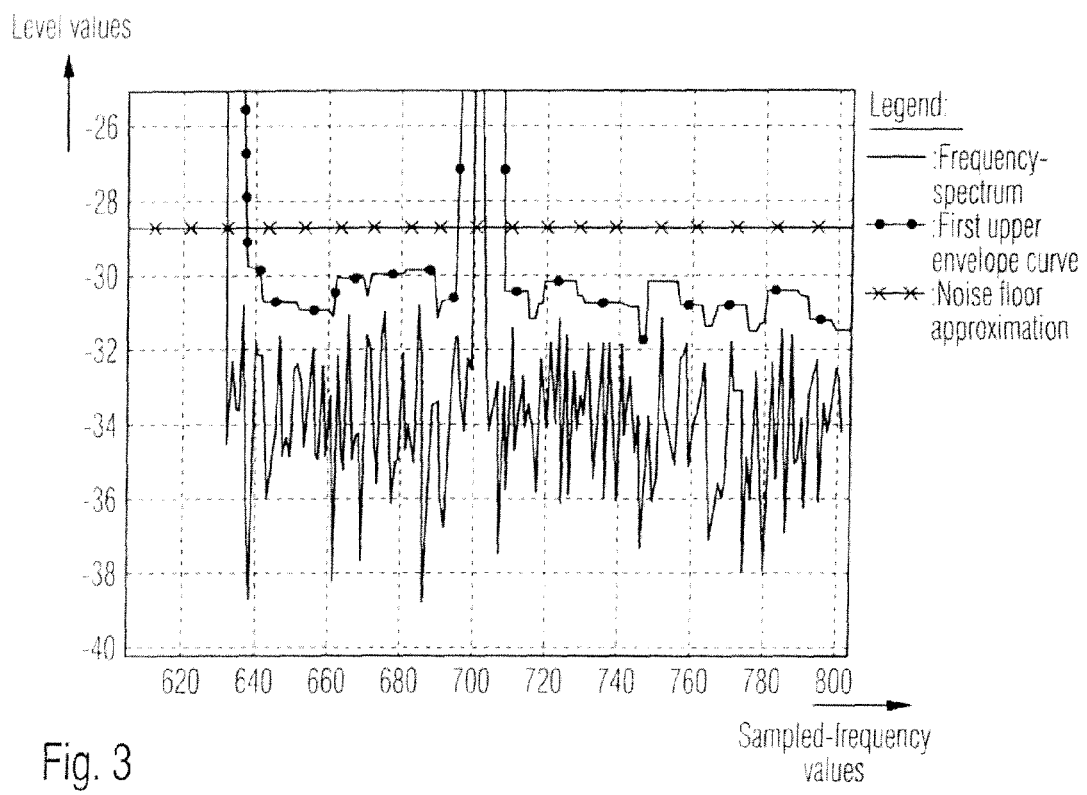
FIG. 3 shows a frequency diagram with noise floor in the frequency spectrum and approximation of the noise floor in the frequency spectrum.

If this has not already been implemented at the present noise floor, an approximation of a noise floor occurring in the detected frequency spectrum is implemented in the next method step S40 in an approximator 6 for approximating a noise floor through ordinate values of the frequency spectrum which are disposed on a horizontal straight line. For this purpose, the ordinate values of the first, upper envelope curve determined in the two preceding method steps S10 and S20 are preferably supplied via a switch 5 to the approximator 6, from which the smallest ordinate value (line with filled circles) is determined as shown in the frequency diagram in FIG. 3, in which a frequency spectrum with a noise floor is presented (continuous line). This smallest ordinate value of the first, upper envelope curve is used as the horizontal ordinate value for the noise floor approximation, which is additionally weighted with a given weighting factor, typically with a weighting factor at the level of 3 dB, to achieve a certain minimum spacing distance between the noise floor in the detected frequency spectrum and the noise floor approximation. Following this, in the same method step S30, the frequency spectrum containing the determined noise floor approximation is generated in the approximator 6.

From the frequency spectrum containing the determined noise-floor approximation, the ordinate values $E_{Lin,U1}(n)$ and respectively $E_{Log,U1}(n)$ or respectively $E_{Lin,D1}(n)$ and $E_{Log,D1}(n)$ of the first upper and lower envelope curve and the ordinate values $E_{Lin,U2}(n)$ and $E_{Log,U2}(n)$ and $E_{Lin,D2}(n)$ and $E_{Log,D2}(n)$ of the second upper and lower envelope curve are determined repeatedly in method steps S10 and S20.

After the determination of the first and second envelope curves of the frequency spectrum containing the determined noise-floor approximation, an upper and/or lower frequency mask which is disposed in each case within the respective first and second envelope curve above or respectively below the ordinate values of the detected frequency spectrum is determined in the next method step S50 in a functional unit 8 for determining ordinate values of a frequency mask disposed between the first and second envelope curve.

Figure 13:
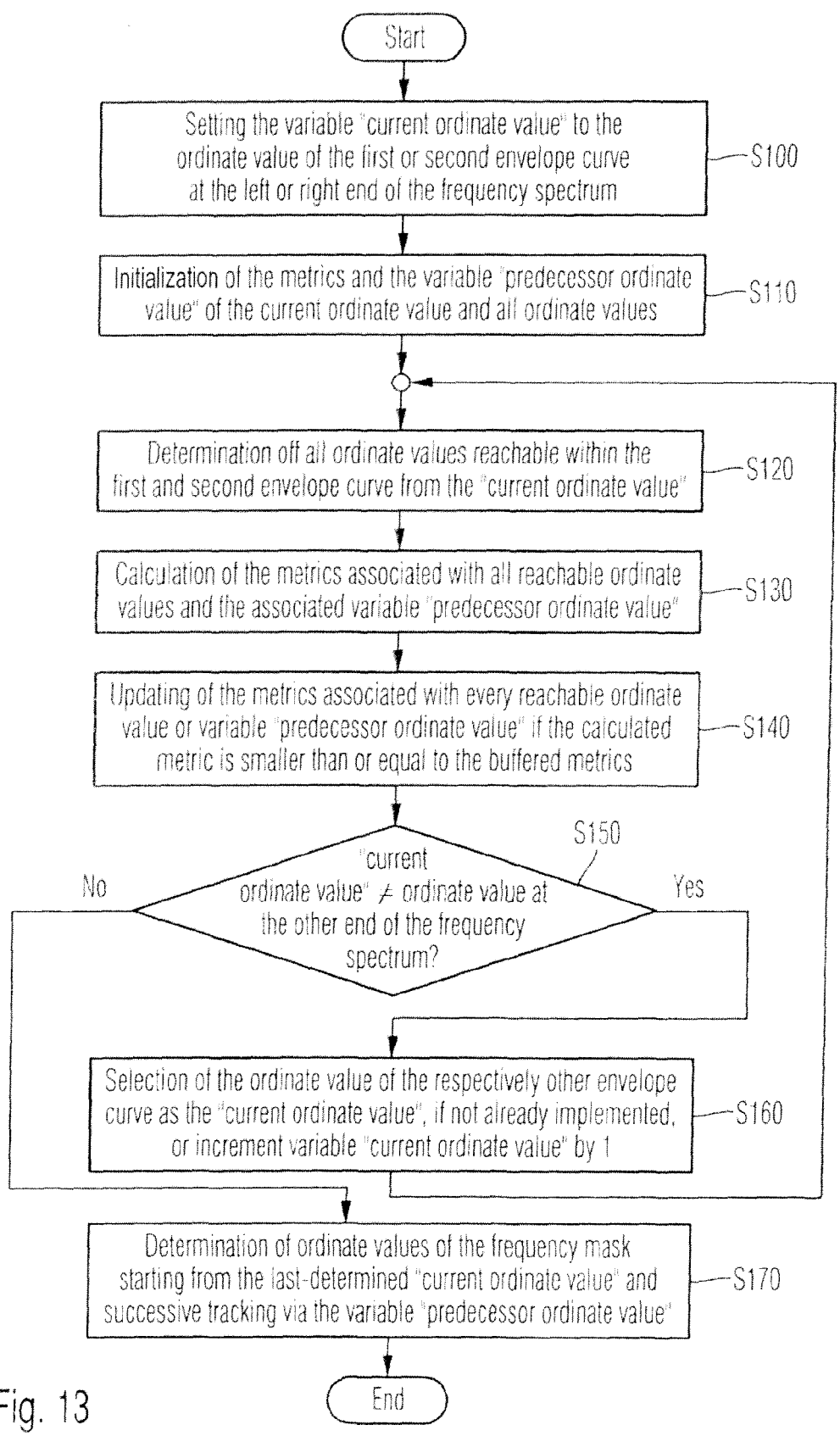
FIG. 13 shows a flow chart of the sub-method for determining the ordinate values of the frequency mask from the ordinate values of the first and second envelope curve.

For this purpose, in a sub-method for determining the ordinate values of the frequency mask from the ordinate values of the first and second envelope curve, as shown in the flow chart in FIG. 13, the ordinate value of the first or second envelope curve at the left or right edge of the frequency spectrum is selected in the first sub-method step S100 as the first ordinate value to be investigated in the sub-method, and a variable "current ordinate value" is defined with the selected ordinate value.

In the next sub-method step S110, all metrics and variables of the first ordinate value to be investigated and all ordinate values to be investigated subsequently are initialised.

For the first ordinate value to be investigated, a metric variable ShortestPathNofNodes, which contains the number of ordinate values on the shortest path from the left or respectively right edge of the frequency spectrum to the ordinate value currently to be investigated, is defined with the value zero. For all subsequent ordinate values to be investigated, the metric variable ShortestPathNofNodes is defined with the value Infinite.

A further metric variable ShortestPathlength, which contains the length of the shortest path from the left or respectively right edge of the frequency spectrum to the ordinate value currently to be investigated, is defined for the first ordinate value to be investigated with the value zero and for all subsequent ordinate values to be investigated with the value Infinite.

Finally, a variable PredecessorNode, which contains the predecessor ordinate value of the ordinate value currently to be investigated on the shortest path from the left or respectively right edge of the frequency spectrum to the ordinate value currently to be investigated with the value "none", is defined.

In the next sub-method step S120, all ordinate values of the first and second envelope curve are determined, which can be reached from the ordinate value currently to be investigated through a linear connection within the first and second envelope curve.

In the subsequent sub-method step S130, all variables of every ordinate value of the first and/or second envelope curve which can be reached from the current ordinate value are calculated with regard to the currently determined path, which extends from the edge of the frequency spectrum to the reachable ordinate value.

The metric variable ShortestPathNofNodes for every reachable ordinate value of the first and/or second envelope curve is obtained for the currently determined path from the value of the metric variable ShortestPathNofNodes of the ordinate value currently to be analyzed incremented by the value 1.

The metric variable ShortestPathlength for every reachable ordinate value of the first and/or second envelope curve is obtained for the currently determined path from the value of the metric variable ShortestPathlength of the ordinate value currently to be analyzed with the addition of the spacing distance between the ordinate value reachable in each case.

The variable "predecessor ordinate value" for every reachable ordinate value of the first and/or second envelope curve is obtained for the currently determined path from the ordinate value currently to be analyzed.

Only in the case that the value of the metric variable ShortestPathNofNodes calculated for the respectively reachable ordinate value is smaller than the respectively buffered value of the metric variable ShortestPathNofNodes, that is, in the event that a path with fewer points has been determined, are the variables ShortestPathNofNodes, ShortestPathlength and "predecessor ordinate value" of the respectively reachable ordinate value updated with the respective values determined in the previous sub-method step S130.

In the case that the value of the metric variable ShortestPathNofNodes calculated for the respectively reachable ordinate value is identical to the respectively buffered value of the metric variable ShortestPathNofNodes, the value of the metric variable ShortestPathlength calculated for the respectively reachable ordinate value is compared with a value of the metric variable ShortestPathlength buffered for the respectively reachable ordinate value, and those variables ShortestPathNofNodes, ShortestPathlength and "predecessor ordinate value" for the respectively reachable ordinate value which are associated with the path with the relatively shorter path length are followed, that is, buffered.

In the next sub-method step S150, a check is carried out to determine whether the ordinate value of the first or second envelope curve buffered in the variable "current ordinate value" and currently to be investigated is already the ordinate value of the first or second envelope curve at the respective other edge of the detected frequency spectrum. If this is not yet the case, that is, if the ordinate value of the first or second envelope curve currently to be analyzed is either the ordinate value at the starting edge of the detected frequency spectrum or an ordinate value between the starting edge and the ending edge of the detected frequency spectrum, in the next sub-method step S160, either the ordinate value at the same sampled-frequency value of the respectively other envelope curve—first or second envelope curve—is selected as the ordinate value currently to be analyzed if this has not already occurred, or the variable "current ordinate value" is incremented by the value 1, and accordingly, the adjacent ordinate value of the first or second envelope curve in the direction of the ending edge of the detected frequency spectrum is selected as the ordinate value currently to be analyzed, and the analysis for this new ordinate value to be analyzed is continued in the sub-method steps S120, S130 and S140.

In the case that the ordinate value of the first or second envelope curve currently to be analyzed corresponds to the ordinate value of the first or second envelope curve at the ending edge of the detected frequency spectrum, the analysis is concluded. In this case, in the concluding sub-method step S170, the ordinate values of the frequency mask are determined, starting from the ordinate value of the first or second envelope curve at the ending edge of the detected frequency spectrum which provides the lowest value of the metric variable ShortestPathLength and accordingly provides the shortest path length to the ordinate value of the first or second envelope curve at the starting edge of the detected frequency spectrum, by determining successively the ordinate values of the first or second envelope curve preceding in each case within the path via the definition of the variable "predecessor ordinate value" of the respectively following ordinate value of the first or second envelope curve.

Figure 2:
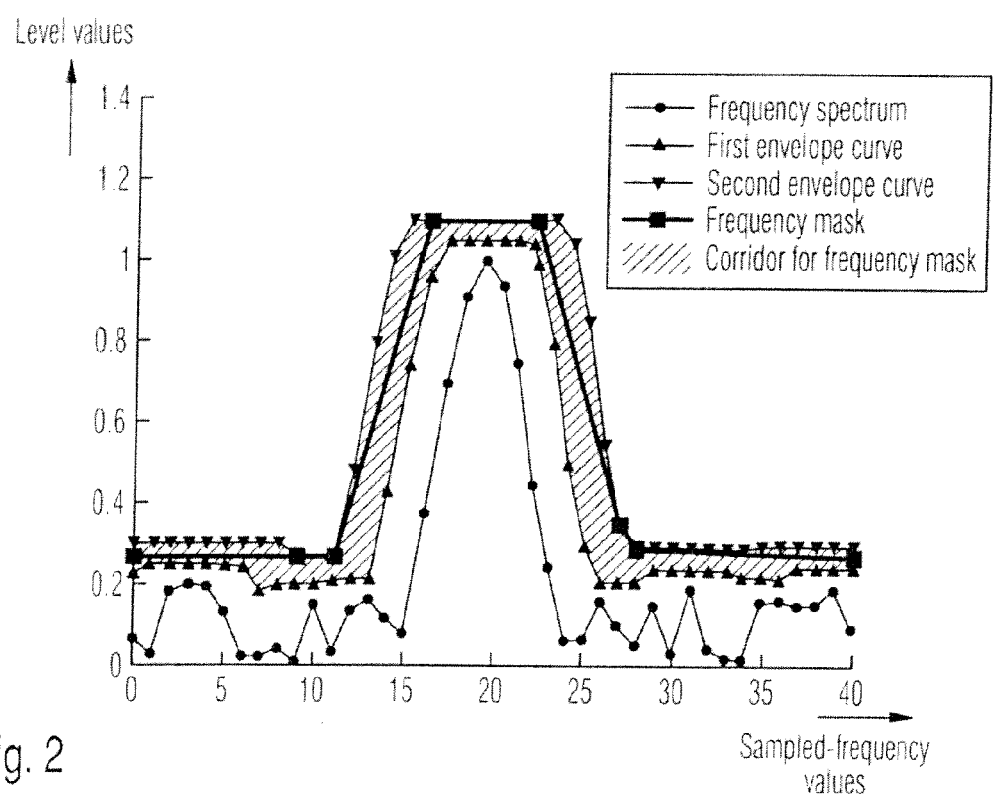
FIG. 2 shows a frequency diagram with frequency spectrum, first and second envelope curve and upper frequency mask according to a first exemplary embodiment of the method according to the invention or the device according to the invention.

The result of such a determination of the ordinate values of the frequency mask is shown in the frequency diagram of FIG. 2, in which the first and second upper envelope curve is presented for a detected frequency spectrum. The first and second envelope curve form the two limits of a corridor illustrated by shading, within which the frequency mask to be determined, of which the ordinate values are either ordinate values of the first envelope curve and/or ordinate values of the second envelope curve, is disposed.

The sub-method for optimizing the frequency mask in the environment of maxima or minima contained in method step S60, the sub-method for optimizing the frequency mask in the transitional region between the noise floor and the frequency region adjacent to the noise floor contained in method step S70 and the sub-method for optimizing the frequency mask in the region of the edges contained in method step S80 are explained in greater detail below.

Figure 12B:
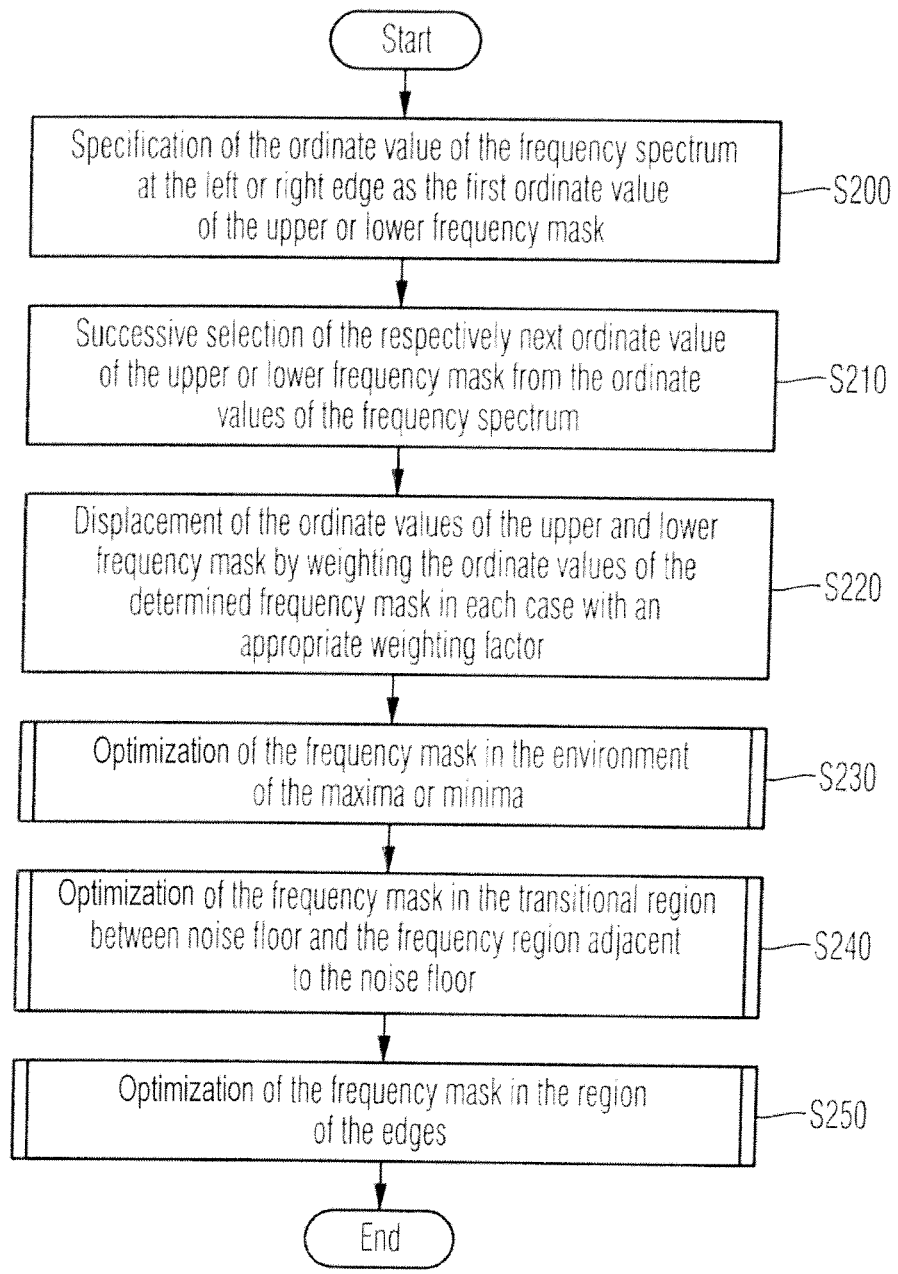
FIG. 12B shows a flow chart of the second exemplary embodiment of the method according to the invention for determining a frequency mask for a frequency spectrum.
Figure 15B:
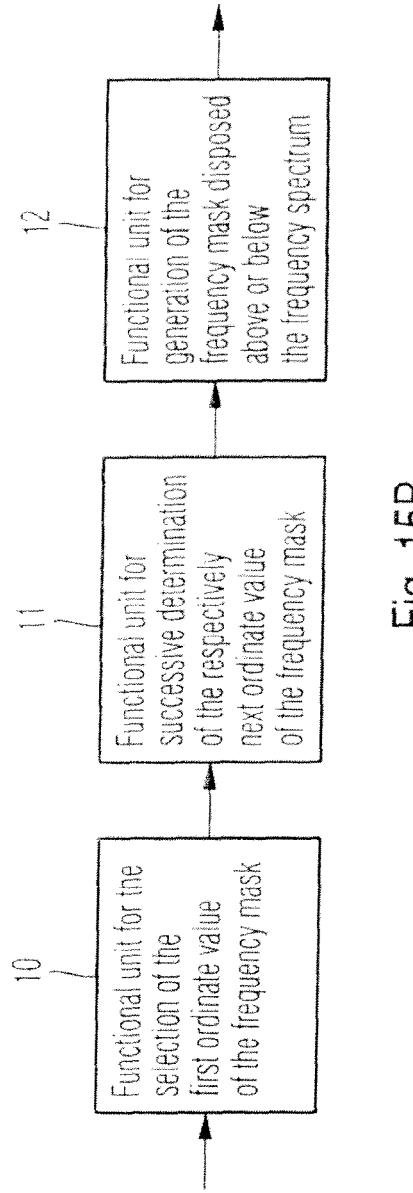
FIG. 15B shows a block diagram of a second exemplary embodiment of the device according to the invention for determining a frequency mask for a frequency spectrum.

In the following section, the second exemplary embodiment of the method according to the invention for determining a frequency mask for a frequency spectrum is explained with a reference to the flow chart in FIG. 12B and the associated, second exemplary embodiment of the device according to the invention for determining a frequency mask for a frequency spectrum in FIG. 15B.

In the first method step S200, in a functional unit for selecting the first ordinate value of the frequency mask 10, an ordinate value at the left or right edge of the detected frequency spectrum is selected as the first ordinate value of the frequency mask.

Starting from this first ordinate value of the frequency mask, in the next method step S210, in a functional unit 11 for the successive determination of the respectively next ordinate value of the frequency mask, the respectively next ordinate value of the frequency mask is determined from the ordinate values of the detected frequency spectrum, which is disposed furthest away from the respectively last-determined ordinate value of the frequency mask. As an additional condition for the selection of the next ordinate value of the frequency mask, it must be the case that all ordinate values of the detected frequency spectrum, of which the associated sampled-frequency values are disposed between the sampled-frequency value of the last-determined ordinate value of the frequency mask and the sampled-frequency value of the next ordinate value of the frequency mask to be determined, each provide a vertical spacing distance relative to the connecting line between the last-determined ordinate value and the ordinate value of the frequency mask to be determined next, which is smaller than a specified threshold value.

Figure 4A:
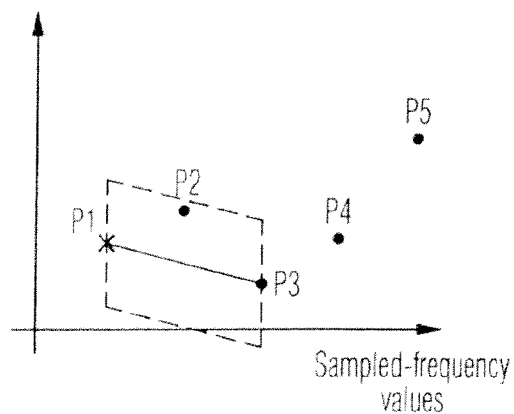
FIGS. 4A, 4B, 4C, and 4D show frequency diagrams visualizing the method of functioning of the second exemplary embodiment of the method according to the invention and respectively of the device according to the invention.
Figure 4B:
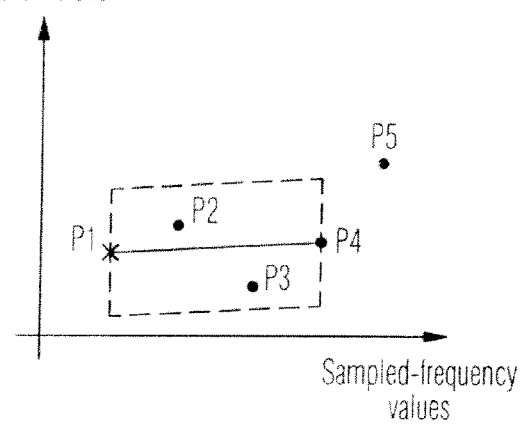

The procedure of the method step S210 is presented by way of example in FIGS. 4A to 4D. In FIG. 4A, the ordinate value P1 disposed at the left edge of the frequency spectrum is selected as the first ordinate value of the frequency mask. The cross serves as a marker for the selection of an ordinate value of the frequency spectrum as an ordinate value of the frequency mask. Since the ordinate value P2 of the frequency spectrum provides a vertical spacing distance relative to the connecting line between the ordinate value P1 last selected as an ordinate value of the frequency mask and the ordinate value P3 potentially to be selected as the next ordinate value of the frequency mask which is smaller than the threshold value represented by the dotted line, in the next step presented in FIG. 4B, the ordinate value P4, which provides a relatively larger spacing distance relative to the last-selected ordinate value P1 of the frequency mask, can be investigated for its suitability as a potential, next ordinate value of the frequency mask.

Figure 4C:
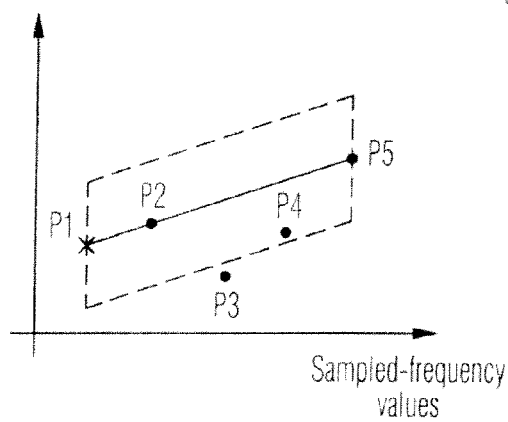
Figure 4D:
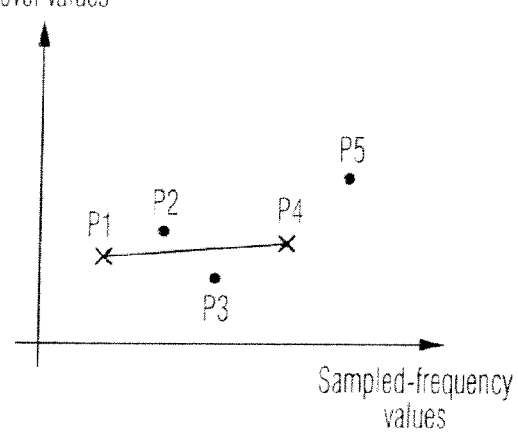

Since, in this step also, the ordinate values P2 and P3 disposed between the last-selected ordinate value P1 of the frequency mask and the ordinate value P4 potentially to be selected as the next ordinate value of the frequency mask provide, with regard to their sampled-frequency values, a smaller vertical spacing distance relative to the connecting line between the two ordinate values P1 and P4 by comparison with the threshold value, the ordinate value P5 must be investigated in a further step presented in FIG. 4C with regard to its suitability as the next ordinate value of the frequency mask. Since the ordinate value P3 of which the vertical spacing distance relative to the connecting line is greater than the threshold value presented in FIG. 4C is disposed with a connecting line between the ordinate value P1 last selected as the ordinate value of the frequency mask and the ordinate value P5 potentially to be selected as the next ordinate value of the frequency mask, the ordinate value P4 is selected as the next ordinate value of the frequency mask rather than the ordinate value P5, as presented in FIG. 4D.

In the concluding method step S220, in a functional unit 12 for generating the frequency mask disposed above and below the frequency spectrum, the accordingly determined ordinate values of the frequency mask are displaced by weighting in each case with a weighting factor to such an extent that in each case an upper and lower frequency mask is formed which comes to be disposed at a given a vertical spacing distance relative to the detected frequency spectrum.

The sub-method for optimizing the frequency mask in the environment of maxima or minima contained in method step S230, the sub-method for optimizing the frequency mask in the transitional region between the noise floor and the frequency region adjacent to the noise floor contained in method step S240 and the sub-method for optimizing the frequency mask in the region of the edges contained in method step S250 are explained in detail below.

Figure 5:
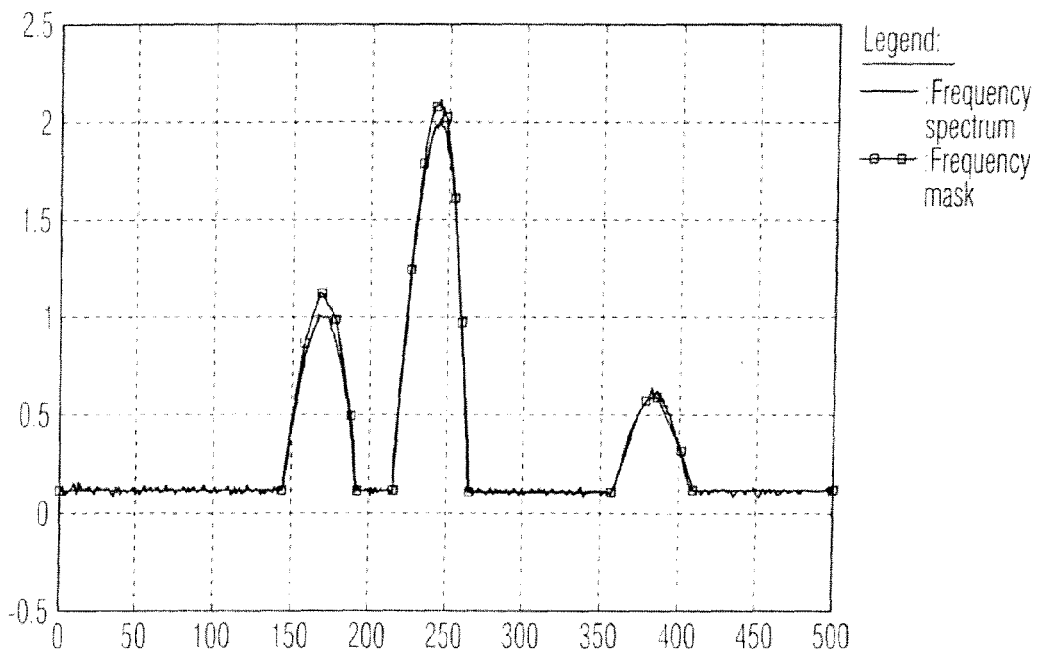
FIG. 5 shows a frequency diagram with frequency spectrum and frequency mask according to the second exemplary embodiment of the method according to the invention and respectively of the device according to the invention.

FIG. 5 presents the detected frequency spectrum (continuous line) and the frequency mask (line with squares) determined with the second exemplary embodiment of the method according to the invention and respectively with the second embodiment of the device according to the invention.

Figure 14A:
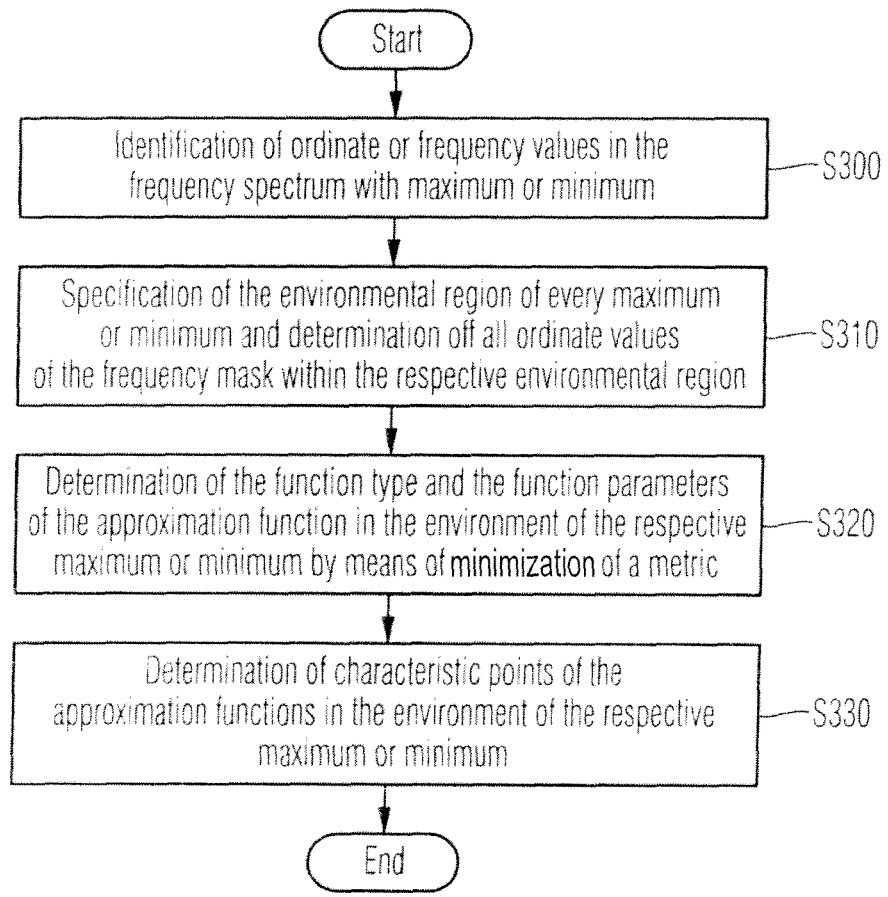
FIG. 14A shows a flow chart of the sub-method for optimizing the frequency mask in the environment of maxima or minima.
Figure 16A:
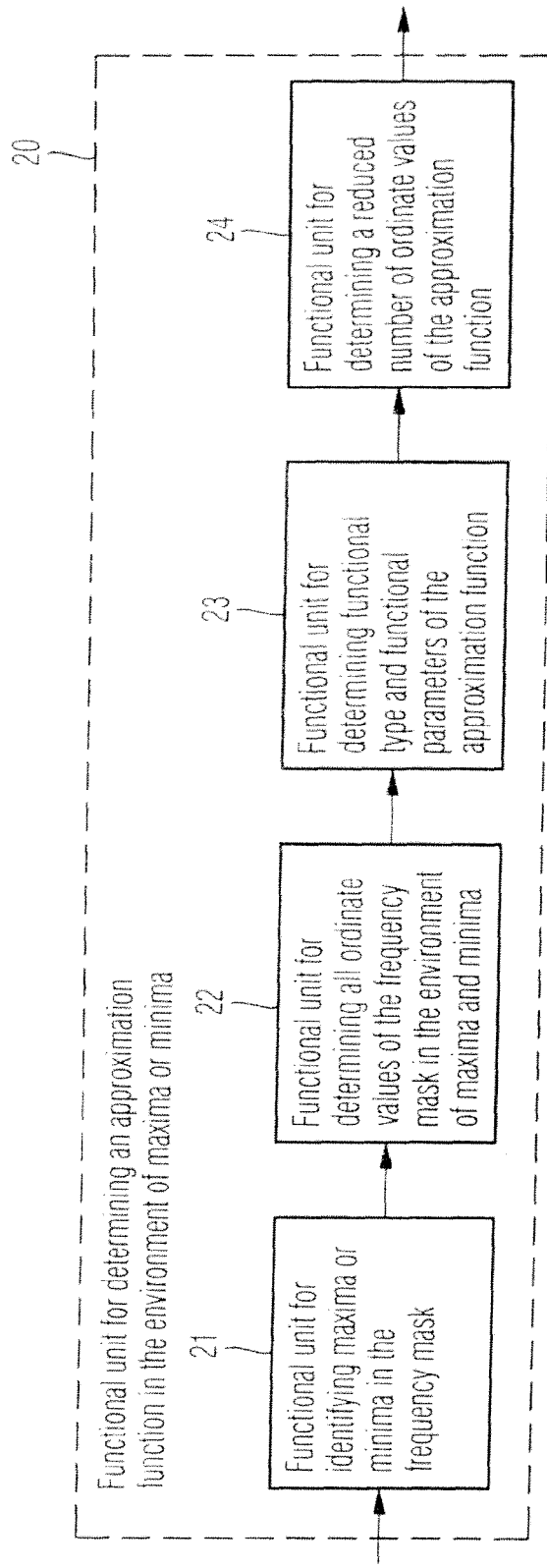
FIG. 16A shows a block diagram of a functional unit for optimizing the frequency mask in the environment of maxima or minima.

In the following section, the sub-method for optimizing the frequency mask in the environment of maxima or minima is described in detail with reference to the flow chart in FIG. 14A, and the associated functional unit 20 for determining an approximation function in the environment of maxima or minima is described in FIG. 16A.

Figure 6A:
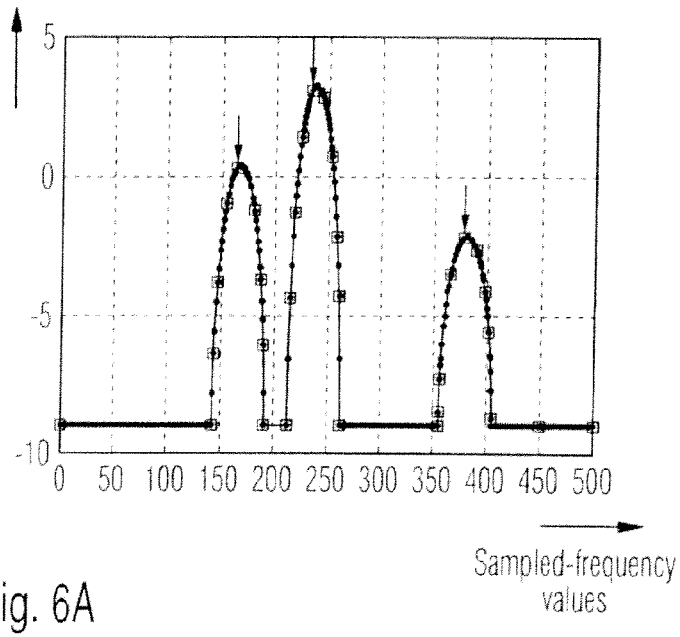
FIGS. 6A, 6B, 6C, and 6D show frequency diagrams visualizing the optimization of the frequency mask in the environment of maxima by a parabolic approximation function.
Figure 8B:
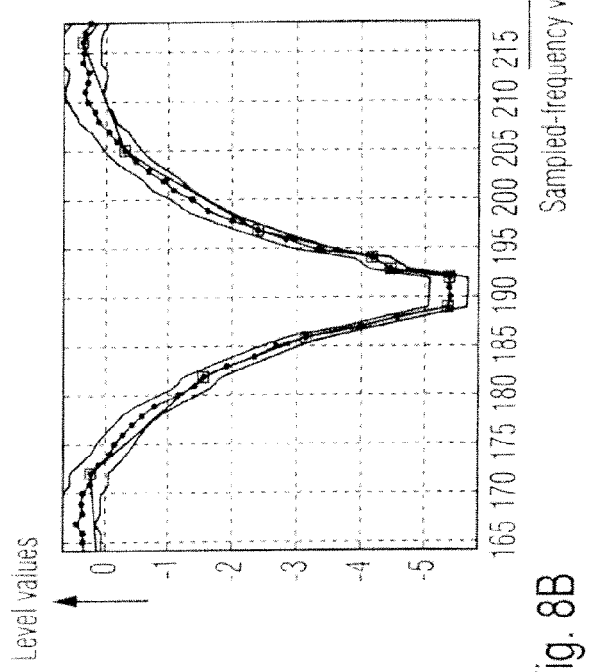
FIGS. 8A and 8B show frequency diagrams visualizing the optimization of the frequency mask in the environment of minima.
Figure 8A:
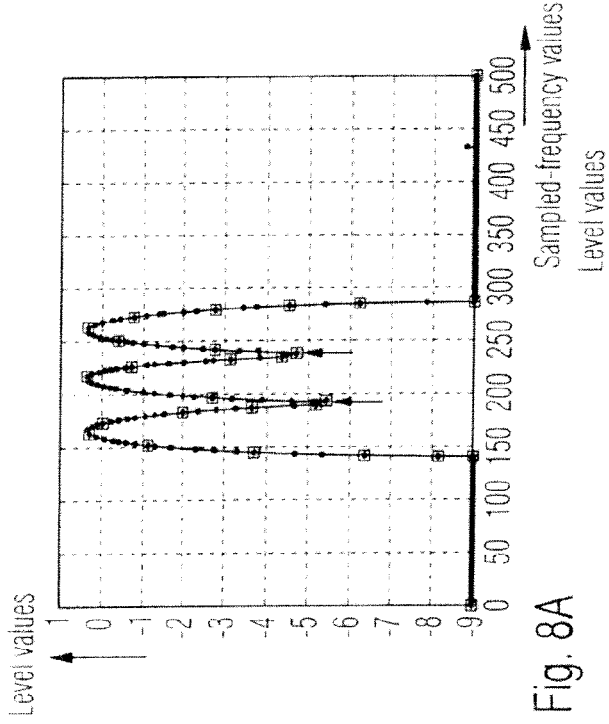

In the first sub-method step S300, in the functional unit 21 for identifying maxima or minima in the frequency mask, the local maxima and/or local minima occurring in the frequency mask are identified on the basis of the ordinate values of the frequency mask determined in method step S50 of the first method according to the invention for determining a frequency mask for a frequency spectrum or on the basis of the ordinate values of the frequency mask determined in method step S220 of the second method according to the invention for determining a frequency mask for a frequency spectrum. For this purpose, it is established for every determined ordinate value of the frequency mask, whether the first derivation is zero—criterion for an extreme—and whether the second derivation is greater or smaller than zero—criterion for a minimum or a maximum. In FIG. 6A, the determined local maxima of the ordinate values of the frequency mask and in FIG. 8A, the determined local minima of the ordinate values of the frequency mask are marked with an arrow.

Figure 6B:
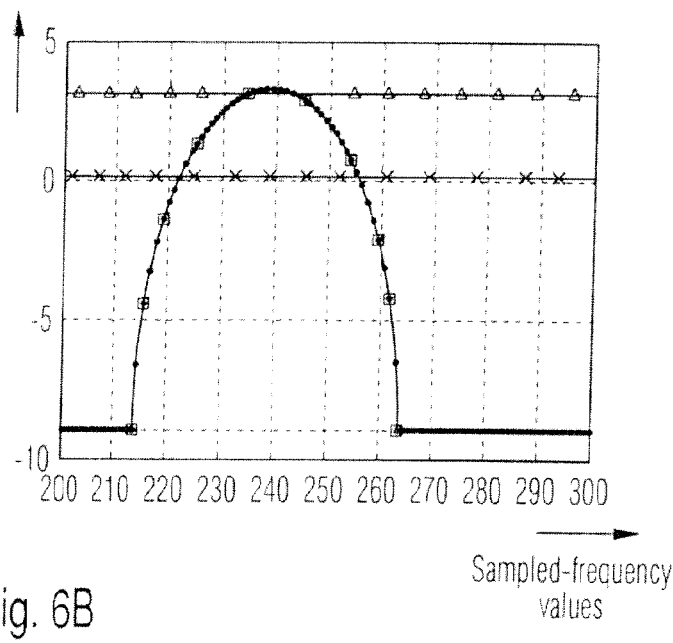

In the next sub-method step S310, in the functional unit 22 for determining all ordinate values of the frequency mask in the environment of maxima and minima, all ordinate values of the frequency mask in the environment of the maximum or minimum are determined. As shown in FIG. 6B, for this purpose, all ordinate values of the frequency mask are determined, which are disposed between a horizontal line through the respectively identified local maximum (line with triangles) and a horizontal line through a threshold below the respectively identified local maximum—in FIG. 6B, a horizontal line with a threshold value, which is disposed 3 dB below the respectively identified local maximum (line with crosses).

In the next sub-method step S320, in the functional unit 23 for determining the function type and function parameters of the approximation function, the function type and the function parameters of the approximation function are determined for the determined frequency mask in the environment of the maximum and respectively minimum. For this purpose, a metric, for example, the error square or the error modulus, is determined and minimized between the ordinate values of the frequency mask determined in the environment of the maximum or respectively minimum and the ordinate values of the approximation function to be determined within the same frequency region.

Figure 6C:
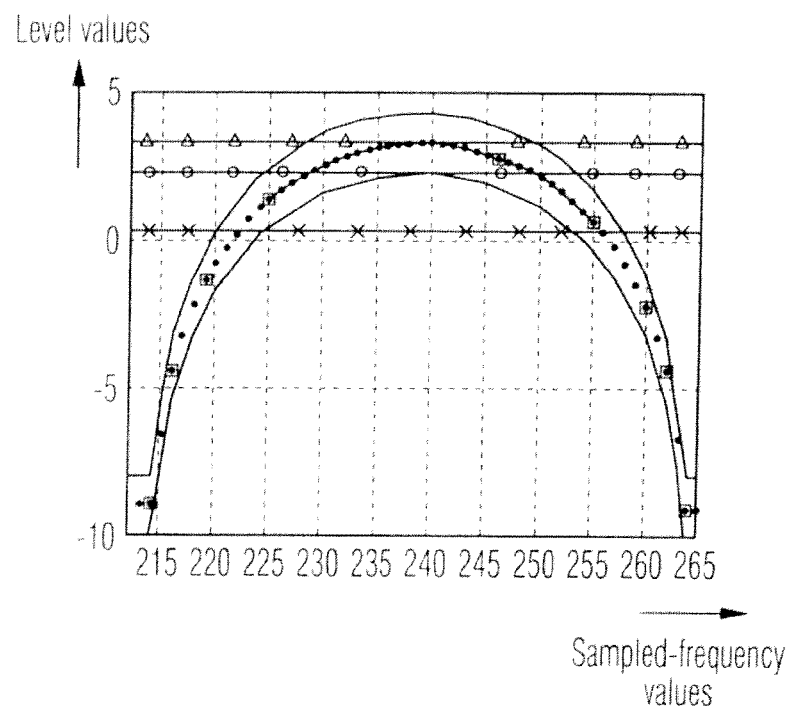

For the ordinate values of the approximation function, it is the case that, in the case of a maximum, they all come to be disposed either above the ordinate values of the frequency mask or within a given tolerance region below the ordinate values of the frequency mask, and, in the case of a minimum, either below the ordinate values of the frequency mask or within a given tolerance region above the ordinate values of the frequency mask. Moreover, in the case of a maximum, all ordinate values of the approximation function must be disposed above the ordinate values of the first envelope curve, and, in the case of a minimum, below the ordinate values of the first envelope curve. The approximation function with its ordinate values is presented as a line with squares in FIG. 6C for the case of a maximum and in FIG. 8B for the case of a minimum.

Figure 6D:
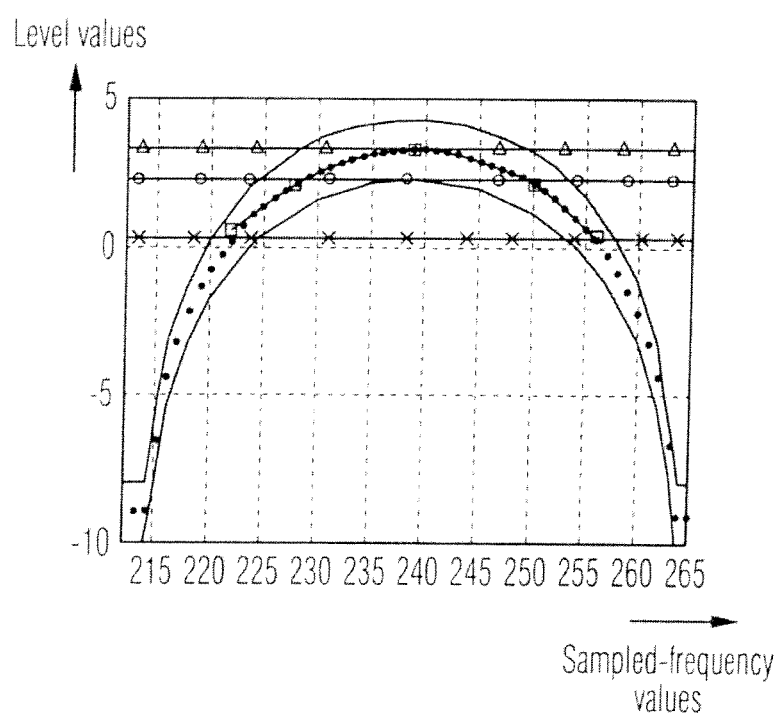

In the concluding sub-method step S330, in a functional unit 24 for determining a reduced number of ordinate values of the approximation function, the determined approximation function is approximated through characteristic points. These characteristic points can be disposed in the case of a parabolic approximation function in the environment of a maximum at the maximum of the parabolic approximation function, with a first threshold value below the maximum, for example, with a threshold value 1 dB below the maximum, and with a second threshold value below the maximum, for example, with a threshold value 3 dB below the maximum. With a parabolic approximation function in the environment of a minimum, these characteristic points can be disposed at the minimum of the parabolic approximation function, at a first threshold value above the minimum, for example, at a threshold value 1 dB above the minimum, and at a second threshold value above the minimum, for example, at a threshold value 3 dB above the minimum. The originally determined ordinate values of the frequency mask are finally replaced by the characteristic points of the approximation function, as presented in FIG. 6D by the line with squares.

If the characteristic points of the approximation function do not come to be disposed on one of the sampled-frequency values of the determined ordinate values of the frequency mask, the characteristic point of the approximation function can be replaced by an alternative characteristic point of the approximation function at the right or left of the next positioned sampled-frequency value.

In the case of a trapeze-shaped approximation function, after the determination of the respective local maximum or local minimum in the characteristic of the ordinate values of the frequency mask according to sub-method step S300, the intersection of a first threshold and a second threshold below the determined local maximum with the characteristic of the ordinate values of the frequency mask, or respectively the intersection of a first threshold and a second threshold above the determined local minimum with the characteristic of the ordinate values of the frequency mask is sought. For example, a value of the determined maximum reduced by 3 dB and a value of the determined maximum reduced by 6 dB, or alternatively, a value of the determined maximum reduced by 1 dB and a value of the determined maximum reduced by 3 dB or 6 dB can be used as threshold values for the first and second threshold.

Figures 7A, 7B, 7C, 7D:
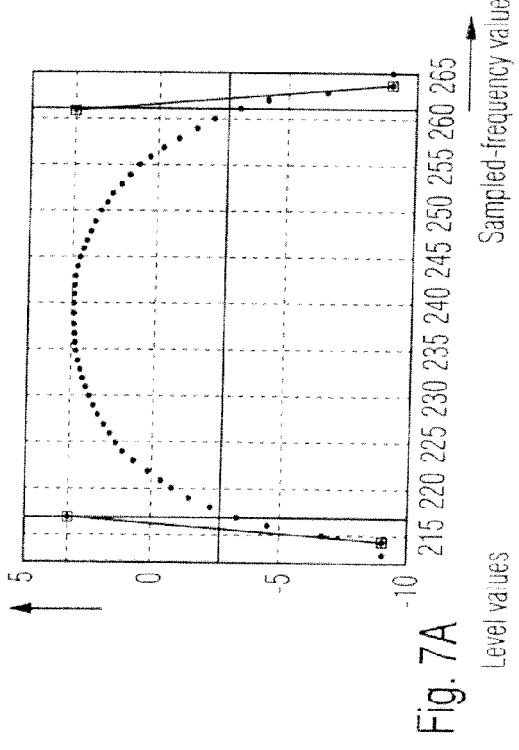
FIGS. 7A, 7B, 7C, and 7D show frequency diagrams visualizing the optimization of the frequency mask in the environment of maxima by a trapeze-shaped approximation function.

The four corner points of the trapeze-shaped approximation function are obtained from the intersections of the second threshold with the characteristic of the ordinate values of the frequency mask and the ordinate values of a horizontal line through the maximum or respectively minimum at the sampled-frequency value of the intersections of the first threshold with the characteristic of the ordinate values of the frequency mask. The four corner points of the trapeze-shaped approximation function are therefore the squares connected by the lines of a trapeze, as shown in FIG. 7A in the case of a first threshold with a value of the determined maximum reduced by 6 dB and a second threshold with a value of the determined maximum reduced by 10 dB, and, as shown in FIG. 7B for the case of a first threshold at a value of the determined maximum reduced by 1 dB and a second threshold at a value of the determined maximum reduced by 3 dB.

If the trapeze-shaped approximation function extends at least partially in a given frequency region below the determined ordinate values of the frequency mask, as presented in FIG. 7A, one of the two upper corner points or both of the upper corner points must be displaced in the direction of the sampled-frequency value of the respectively associated lower corner point of the trapeze-shaped approximation function, as presented in FIG. 7D.

Figure 14B:
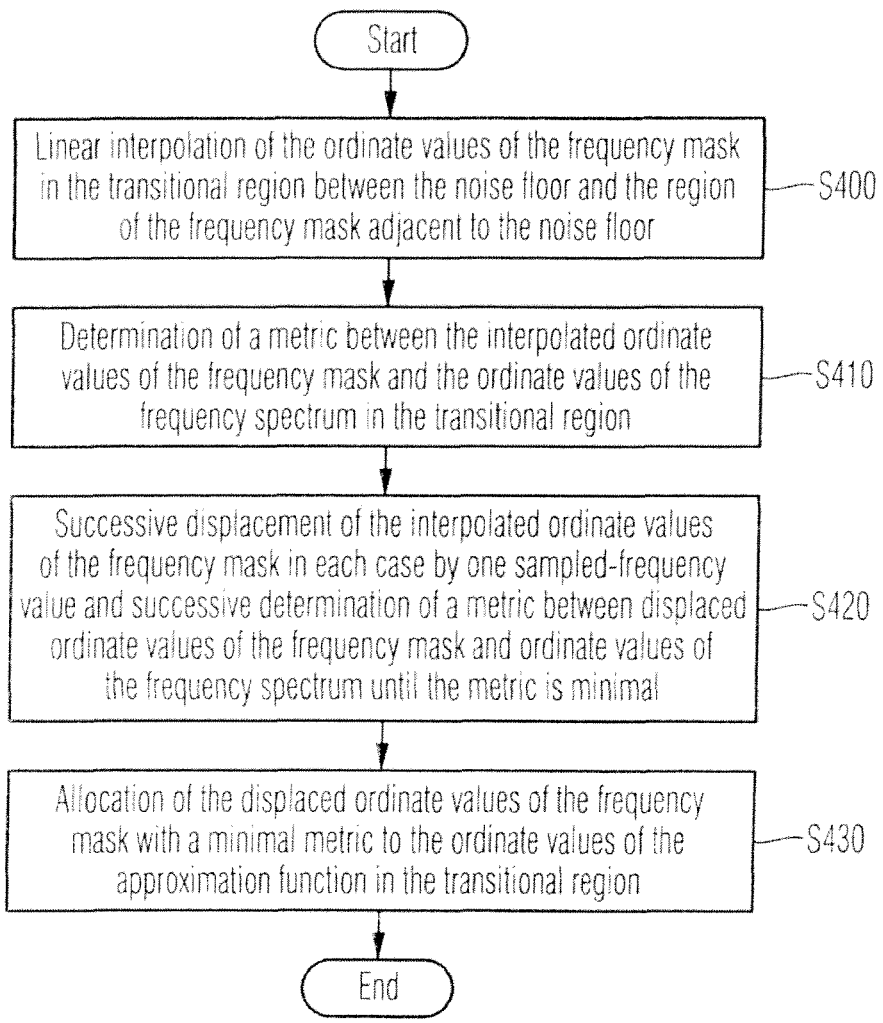
FIG. 14B shows a flow chart of the sub-method for optimizing the frequency mask in the transitional region between noise floor and a frequency region of the frequency mask adjacent to the noise floor.
Figure 16B:
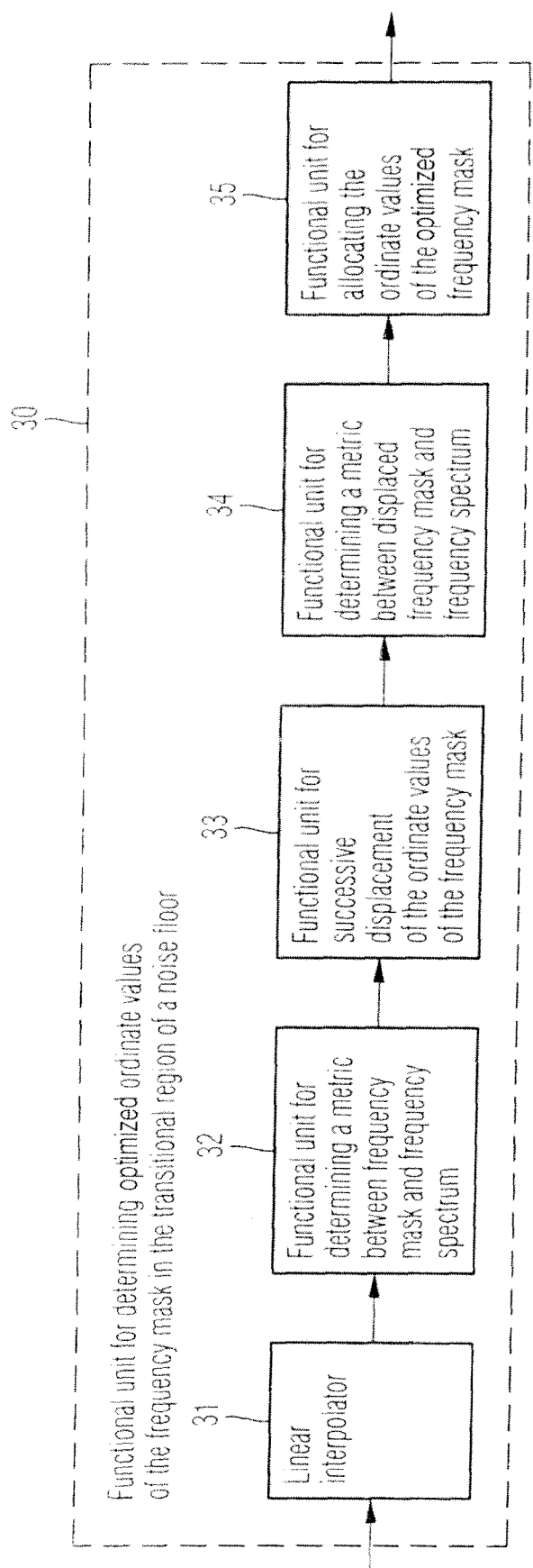
FIG. 16B shows a block diagram of a functional unit for optimizing the frequency mask in the transitional region between the noise floor and a frequency region of the frequency mask adjacent to the noise floor.

In the following section, the sub-method for optimizing the frequency mask in the transitional region between a noise floor and a frequency region adjacent to the noise floor is described with reference to FIG. 14B, and the associated functional unit 30 for determining optimized ordinate values of the frequency mask in the transitional region of a noise floor is described with reference to FIG. 16B.

Figure 9:
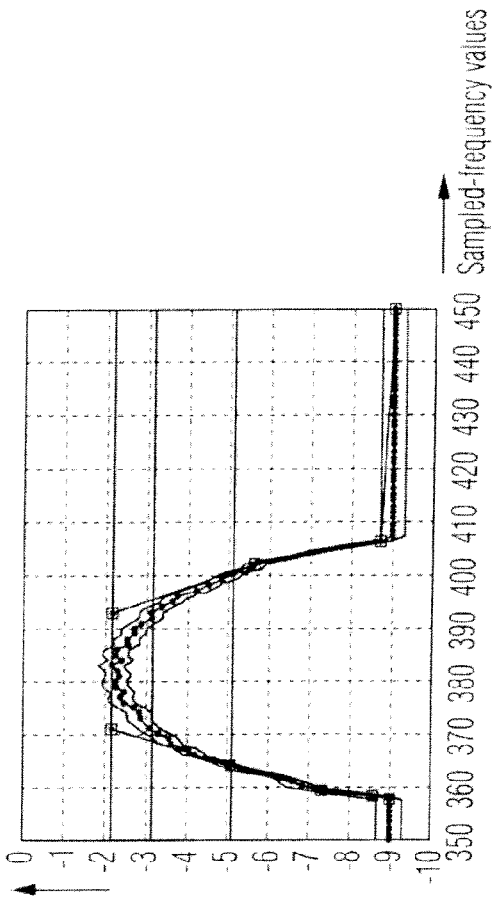
FIG. 9 shows a frequency diagram with non-optimized frequency mask in the transitional region between noise floor and a frequency region of the frequency mask adjacent to the noise floor.

As shown in FIG. 9, the transitional region at the left noise floor is adapted in an optimal manner by ordinate values of the frequency mask, because the ordinate value of the frequency mask at the transitional point between the noise floor and the frequency region adjacent to the noise floor corresponds to the ordinate value of the noise floor. The transitional region at the right noise floor, by contrast, is not adapted in an optimal manner by the ordinate values of the frequency mask, because the ordinate value of the frequency mask at the transitional point between the noise floor and the frequency region adjacent to the noise floor provides a relatively higher ordinate value than the ordinate value of the noise floor.

To optimize the transitional region between the noise floor and the frequency region adjacent to the noise floor, in the first sub-method step S400, ordinate values of the frequency mask are determined in a linear interpolator 31 at the individual sampled-frequency values of the ordinate values of the detected frequency spectrum by means of linear interpolation from the reduced number of ordinate values of the frequency mask determined in method step S50 of the first exemplary embodiment of the method according to the invention for a frequency spectrum, or respectively in method step S220 of the second exemplary embodiment of the method according to the invention.

In the next sub-method step S410, in a functional unit 32 for determining a metric between the frequency mask and the frequency spectrum, a metric, for example, the error squares or the error moduli between the ordinate values of the detected frequency spectrum and the interpolated ordinate values of the frequency mask at the transitional region between the noise floor and the frequency region adjacent to the noise floor are calculated. A given number of ordinate values in the noise floor and at the same time in the frequency region adjacent to the noise floor is typically used for this purpose.

In the next sub-method step S420, in a functional unit 33 for a successive displacement of the ordinate values of the frequency mask, the linear optimized ordinate values of the frequency mask are displaced in each case by one sampled-frequency value to the right in the case of a noise floor adjacent to the transitional region on the right side and to the left in the case of a noise floor adjacent to the transitional region on the left side.

With the ordinate values of the frequency mask displaced respectively by one sampled-frequency value and the ordinate values of the frequency spectrum, a metric, for example, the error squares or the error moduli, between the ordinate values of the detected frequency spectrum and the interpolated ordinate values of the frequency mask in the transitional region displaced respectively by one sampled-frequency value between the noise floor and the frequency region adjacent to the noise floor is calculated in a functional unit 34 for determining a metric between the displaced frequency mask and the frequency spectrum.

If the new calculated metric is reduced by comparison with the previously calculated metric, in sub-method step S420, the ordinate values of the frequency mask are again displaced respectively by one sampled-frequency value, and a new metric with the newly displaced ordinate values of the frequency mask and the ordinate values of the frequency spectrum is determined. This iteration is implemented until a minimal metric is determined.

In the concluding method step S430, the linear interpolated ordinate values of the frequency mask displaced by a given number of sampled-frequency values with a minimal metric are allocated in a functional unit 35 for the allocation of the ordinate values of the optimized frequency mask to the optimized ordinate values of the approximation function.

Figure 10A:
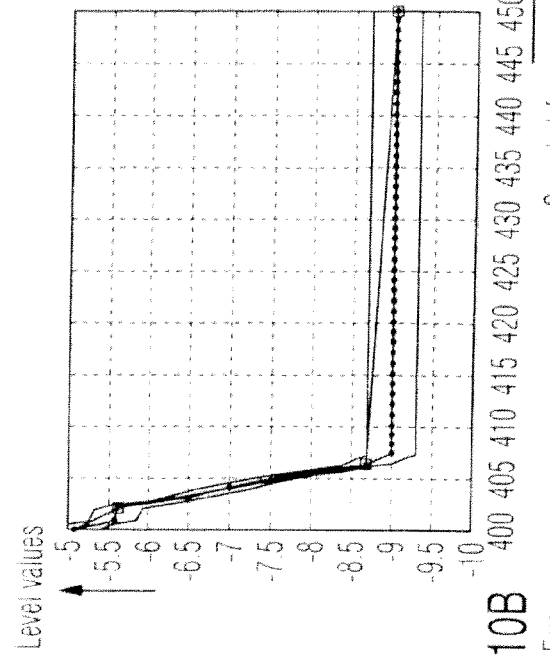
FIGS. 10A and 10B show frequency diagrams visualizing the optimization of the frequency mask in the transitional region between noise floor and a frequency region of the frequency mask adjacent to the noise floor.
Figure 11A:
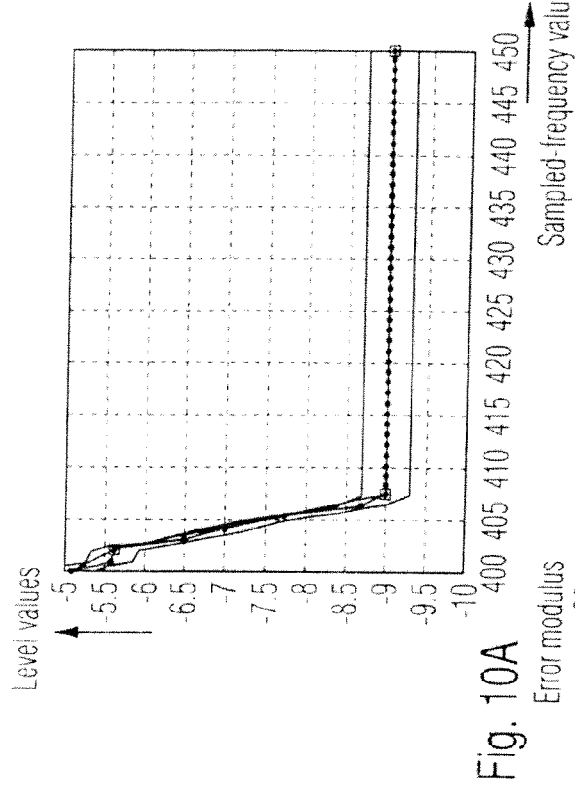
FIGS. 11A and 11B show diagrams with error modulus and error squares between a displaced frequency mask and frequency spectrum dependent upon the sampled-frequency value.

In FIG. 10A, the optimized ordinate values of the approximation function of a frequency mask in the transitional region between a noise floor and a frequency region positioned on the left of the noise floor are presented. By comparison with this, the non-optimized ordinate values of the frequency mask in the transitional region between the noise floor and a frequency region positioned on the left of the noise floor are presented in FIG. 10B.

Figures 10B, 11B:
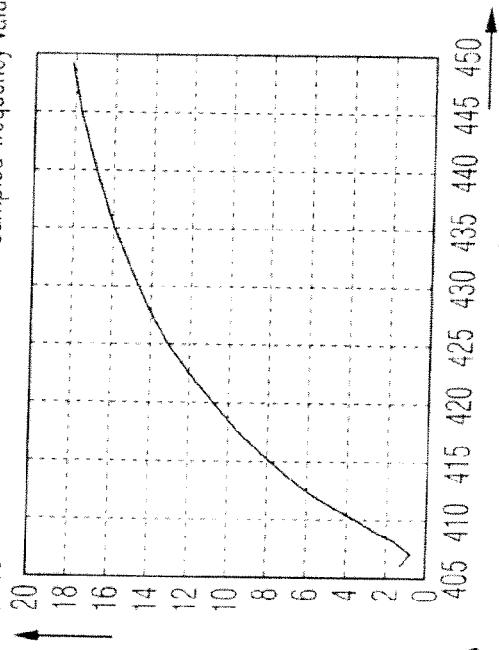

From Figure in 11A, the metric which uses the error moduli between the ordinate values of the frequency spectrum and the displaced ordinate values of the frequency mask is plotted against the sampled-frequency value, and in FIG. 11B, the metric which uses the error squares between the ordinate values of the frequency spectrum and the displaced ordinate values of the frequency mask is plotted against the sampled-frequency value. In both diagrams, it is evident that a minimal metric is present with a displacement of the first ordinate value of the frequency mask disposed on the noise floor to the sampled-frequency value 407.

To optimize the frequency mask in the region of the edges, the number of ordinate values of the frequency mask disposed in the region of the edges is optimized. The optimization of the number of ordinate values of the frequency mask is once again implemented on the basis of the first or second method for determining the frequency mask for a frequency spectrum.

The invention is not restricted to the embodiments presented. In particular, the invention can also be transferred and used for the automatic generation of masks for time signals.

The invention claimed is:

1. A method for determining a frequency mask disposed above or below a frequency spectrum of a detected signal with the following method steps running automatically on a computer device:
   determining every individual ordinate value of a first envelope curve disposed completely above or below the frequency spectrum as a maximum value or respectively minimum value of a given number of respectively adjacent ordinate values ($S_{Lin}(n)$, $S_{Log}(n)$) of the frequency spectrum linked to a window function ($w_{Lin}(n)$, $w_{log}(n)$),
   determining every individual ordinate value of a second envelope curve disposed completely above or below the frequency spectrum and completely above or below the first envelope curve as a maximum value or respectively minimum value of a given number of respectively adjacent ordinate values ($S_{Lin}(n)$, $S_{Log}(n)$) of the frequency spectrum linked to a window function ($w_{Lin}(n)$, $w_{Log}(n)$) and
   determining a minimum number of ordinate values of the frequency mask disposed completely between the first and second envelope curve from ordinate values ($E_{Lin,U1}(n)$, $E_{Log,U1}(n)$, $E_{Lin,D1}(n)$, $E_{Log,D1}(n)$, $E_{Lin,U2}(n)$, $E_{Log,U2}(n)$, $E_{Lin,D2}(n)$, $E_{Log,D2}(n)$) of the first and/or second envelope curve, wherein in each case two successive ordinate values of the frequency mask with a maximum horizontal spacing distance within the first and second envelope curve can be reached in a linear manner relative to one another.

2. The method according to claim 1, wherein the window functions ($w_{Lin}(n)$, $w_{Log}(n)$) for determining the first envelope curve ($E_{Lin,U1}(n)$, $E_{Log,U1}(n)$, $E_{Lin,D1}(n)$, $E_{Log,D1}(n)$) and the window functions ($w_{Lin}(n)$, $w_{Log}(n)$) for determining the second envelope curve ($E_{Lin,U2}(n)$, $E_{Log,U2}(n)$, $E_{Lin,D2}(n)$, $E_{Log,D2}(n)$) each provide a different window type.

3. The method according to claim 1, wherein the window functions ($W_{Lin}(n)$, $w_{Log}(n)$) for determining the first envelope curve ($E_{Lin,U1}(n)$, $E_{Log,U1}(n)$, $E_{Lin,D1}(n)$, $E_{Log,D1}(n)$) and the window functions ($w_{Lin}(n)$, $w_{Log}(n)$) for determining the second envelope curve ($E_{Lin,U2}(n)$, $E_{Log,U2}(n)$, $E_{Lin,D2}(n)$, $E_{Log,D2}(n)$) each provides a different width and/or height.

4. The method according to claim 1, wherein the ordinate values ($S_{Lin}(n)$, $S_{Log}(n)$) of the frequency spectrum are linear values $S_{Lin}(n)$ and the linking between the linear ordinate values $S_{Lin}(n)$ of the frequency spectrum and the window function $w_{Lin}(n)$ is a multiplicative weighting.

5. The method according to claim 1, wherein the ordinate values ($S_{Lin}(n)$, $S_{Log}(n)$) of the frequency spectrum are logarithmic values $S_{Log}(n)$ and the linking between the ordinate values $S_{Log}(n)$ of the frequency spectrum and the window function $w_{Log}(n)$ is an additive linking.

6. The method according to claim 1, wherein the individual ordinate values ($E_{Lin,U1}(n)$, $E_{Log,U1}(n)$, $E_{Lin,D1}(n)$, $E_{Log,D1}(n)$, ($E_{Lin,U2}(n)$, $E_{Log,U2}(n)$, $E_{Lin,D2}(n)$, $E_{Log,D2}(n)$)) of the first and second envelope curve are each weighted with a weighting factor ($y_{Lin,U1}$, $y_{Log,U1}$, $y_{Lin,D1}$, $y_{Log,D1}$).

7. The method according to claim 1, wherein a noise floor disposed within the frequency spectrum is approximated by ordinate values of the frequency spectrum disposed on a horizontal straight line, which are determined through the minimum of the determined, first, upper envelope curve weighted with a weighting factor.

8. The method according to claim 7, wherein the weighting factor is +3 dB.

9. The method according to claim 1, wherein a determination of an optimized approximation function for the characteristic of the ordinate values of the frequency mask in the environment of local maxima and/or local minima comprises:
identifying local maxima or minima in the individual ordinate values of the frequency mask,
determining all ordinate values of the frequency mask in the environment of the respective local maximum or of the respective local minimum by determining the ordinate values of the frequency mask between the respective maximum and a threshold value positioned below the respective maximum at a given spacing distance or between the respective minimum and a threshold value positioned above the respective minimum at a given spacing distance, and
determining a function type and function parameters of the approximation function by minimizing a metric between the ordinate values of the frequency mask and the ordinate values of the approximation function in the environment of the respective maximum or the respective minimum.

10. The method according to claim 9, wherein a reduced number of ordinate values of the approximation function is determined at characteristic points of the approximation function.

11. The method according to claim 10, wherein the characteristic points of the approximation function are selected from the group consisting of maximum, maximum with the deduction of a first threshold value, maximum with the deduction of a threshold value or respectively minimum, minimum with the deduction of a first threshold value, minimum with the deduction of a threshold value in the case of a parabolic or Gaussian approximation function or four corner points of a trapeze-shaped approximation function.

12. The method according to claim 9, wherein the ordinate values of the approximation function are disposed above or only within a tolerance band below the ordinate values of the frequency mask in the case of an upper frequency mask and below or only within a tolerance band above the ordinate values of the frequency mask in the case of a lower frequency mask.

13. The method according to claim 9, wherein the ordinate values of the approximation function are disposed above the first envelope curve in the case of an upper frequency mask and below the first envelope curve in the case of a lower frequency mask.

14. The method according to claim 1, wherein the determination of optimized ordinate values of the frequency mask in the transitional region between the noise floor and a frequency region of the frequency spectrum adjacent to the noise floor comprises:
determining a metric between ordinate values of the frequency mask interpolated in a linear manner and the ordinate values of the frequency spectrum in the transitional region,
successively displacing right or left the ordinate values of the frequency mask in each case by one sampled-frequency value and successive determination of the metric between the ordinate values of the frequency mask interpolated in a linear manner and displaced in each case by one sampled-frequency value and the ordinate values of the frequency spectrum in the transitional region until the respectively determined metric is minimal, and
allocating the last-determined ordinate values to the optimized ordinate values of the frequency mask in the transitional region.

15. The method according to claim 1, wherein in the regions between the maximum values and/or the minimum values, the number of ordinate values of the frequency mask is optimized by repeated implementation of the method.

16. The method according to claim 1, wherein the ordinate values of the frequency spectrum, the frequency mask, the first and second envelope curve and the approximation function are spectral values or power values.

17. A method for automatic determination of a frequency mask disposed above or below a frequency spectrum of a detected signal by a computer device, the method comprising selecting a tolerance value, selecting an ordinate value disposed at the left or right end of the frequency spectrum as a first ordinate value of the frequency mask and selecting by successively determining a respectively next ordinate value of the frequency mask as an ordinate value of the frequency spectrum which is disposed at a furthest distance from a respectively last-determined ordinate value of the frequency mask, wherein ordinate values of the frequency spectrum disposed between the current and the last-determined ordinate value of the frequency mask each provides a vertical spacing distance relative to a connecting line between the current and the last-determined ordinate value of the frequency mask that is smaller than the selected tolerance value, and
determining an optimized approximation function for the characteristic of the ordinate values of the frequency mask in the environment of local maxima and/or local minima by:

identifying local maxima or minima in the individual ordinate values of the frequency mask, determining all ordinate values of the frequency mask in an environment of the respective local maximum or of the respective local minimum by determining the ordinate values of the frequency mask between the respective maximum and a threshold value positioned below the respective maximum at a given spacing distance or between the respective minimum and a threshold value positioned above the respective minimum at a given spacing distance, and determining a function type and function parameters of the approximation function by minimizing a metric between the ordinate values of the frequency mask and the ordinate values of the approximation function in the environment of the respective maximum or the respective minimum.

18. The method according to claim 17, wherein the determined ordinate values of the frequency mask are each weighted with a weighting factor to generate the upper or lower frequency mask and disposed above or below the frequency spectrum of the detected signal.

19. The method according to claim 17, wherein a reduced number of ordinate values of the approximation function is determined at characteristic points of the approximation function.

20. The method according to claim 19, wherein the characteristic points of the approximation function are selected from the group consisting of maximum, maximum with the deduction of a first threshold value, maximum with the deduction of a threshold value or respectively minimum, minimum with the deduction of a first threshold value, minimum with the deduction of a threshold value in the case of a parabolic or Gaussian approximation function or four corner points of a trapeze-shaped approximation function.

21. The method according to claim 17, wherein the ordinate values of the approximation function are disposed above or only within a tolerance band below the ordinate values of the frequency mask in the case of an upper frequency mask and below or only within a tolerance band above the ordinate values of the frequency mask in the case of a lower frequency mask.

22. The method according to claim 17, wherein the ordinate values of the approximation function are disposed above the first envelope curve in the case of an upper frequency mask and below the first envelope curve in the case of a lower frequency mask.

23. The method according to claim 17, wherein the determination of optimized ordinate values of the frequency mask in the transitional region between the noise floor and a frequency region of the frequency spectrum adjacent to the noise floor comprises:

determining a metric between ordinate values of the frequency mask interpolated in a linear manner and the ordinate values of the frequency spectrum in the transitional region, successively displacing right or left the ordinate values of the frequency mask in each case by one sampled-frequency value and successive determination of the metric between the ordinate values of the frequency mask interpolated in a linear manner and displaced in each case by one sampled-frequency value and the ordinate values of the frequency spectrum in the transitional region until the respectively determined metric is minimal, and allocating the last-determined ordinate values to the optimized ordinate values of the frequency mask in the transitional region.

24. The method according to claim 17, wherein in the regions between the maximum values and/or the minimum values, the number of ordinate values of the frequency mask is optimized by repeated implementation of the method.

25. The method according to claim 17, wherein the ordinate values of the frequency spectrum, the frequency mask, the first and second envelope curve and the approximation function are spectral values or power values.

26. A device for determining a frequency mask disposed above or below a frequency spectrum of a detected signal, the device comprising:

a computer;

a first functional unit including instructions for execution by the computer to determine ordinate values of a first envelope curve disposed completely above or below the frequency spectrum, a second functional unit including instructions for execution by the computer to determine ordinate values of a second envelope curve disposed completely above or below the frequency spectrum and completely above or below the first envelope curve, and a third functional unit including instructions for execution by the computer to determine ordinate values of a frequency mask disposed between the first and second envelope curve, wherein in each case two successive ordinate values of the frequency mask with a maximum horizontal spacing distance within the first and second envelope curve can be reached in a linear manner relative to one another, and an approximator for approximating a noise floor through ordinate values of the frequency spectrum disposed on a horizontal straight line.

27. The device according to claim 26, wherein the first functional unit including instructions for execution by the computer to determine ordinate values of a first envelope curve disposed completely above or below the frequency spectrum and the second functional unit including instructions for execution by the computer to determine ordinate values of a second envelope curve disposed completely above or below the frequency spectrum and completely above or below the first envelope curve in each case contains a fourth functional unit including instructions for execution by the computer to weigh the ordinate values of the frequency spectrum by multiplying the ordinate values of the frequency spectrum by the window function in the case of linear ordinate values of the frequency spectrum.

28. The device according to claim 26 wherein the first functional unit including instructions for execution by the computer to determine ordinate values of a first envelope curve disposed completely above or below the frequency spectrum and the second functional unit including instructions for execution by the computer to determine ordinate values of a second envelope curve disposed completely above or below the frequency spectrum and completely above or below the first envelope curve in each case contains a fifth functional unit including instructions for execution by the computer to additively weigh the ordinate values of the frequency spectrum in the case of logarithmic ordinate values of the frequency spectrum.

29. The device according to claim 26, wherein the first functional unit including instructions for execution by the computer to determine ordinate values of a first envelope curve disposed completely above or below the frequency spectrum and the second functional unit including instructions for execution by the computer to determine ordinate values of a second envelope curve disposed completely above or below the frequency spectrum and completely above or below the first envelope curve in each case contains a sixth functional unit including instructions for execution by the computer to weigh the ordinate values of the first or second envelope curve with a weighting factor.

30. The device according to claim 26, additionally comprising a seventh functional unit including instructions for execution by the computer to determine an optimized approximation function for the characteristic of ordinate values of the frequency mask in the environment of maxima or minima, which contains an eighth functional unit including instructions for execution by the computer to identify maxima or minima of the ordinate values of the frequency mask, a ninth functional unit including instructions for execution by the computer to determine all ordinate values of the frequency mask in the environment of the respective local maximum or the respective local minimum and a tenth functional unit including instructions for execution by the computer to determine a function type and function parameters of the approximation function.

31. The device according to claim 30, wherein the seventh functional unit including instructions for execution by the computer to determine an optimized approximation function for the characteristic of the ordinate values of the frequency mask in the environment of maxima or minima contains an eleventh functional unit including instructions for execution by the computer to determine a reduced number of ordinate values of the approximation function at characteristic points of the approximation function.

32. The device according to claim 31, wherein the characteristic points of the approximation function are selected from the group consisting of maximum, maximum with the deduction of a first threshold value, maximum with the deduction of a threshold value or respectively minimum, minimum with the deduction of a first threshold value, minimum with the deduction of a threshold value in the case of a parabolic or Gaussian approximation function or four corner points of a trapeze-shaped approximation function.

33. The device according to claim 26, comprising a twelfth functional unit including instructions for execution by the computer to determine optimized ordinate values of the frequency mask in the right or left transitional region between the noise floor and a region adjacent to the noise floor of the frequency spectrum is provided, which contains a linear interpolator for the linear interpolation of the ordinate values of the frequency mask, a thirteenth functional unit including instructions for execution by the computer to determine a metric between the linear optimized ordinate values of the frequency mask and the ordinate values of the frequency spectrum, a fourteenth functional unit including instructions for execution by the computer to successively left or right displace the ordinate values of the frequency mask in each case by one sampled-frequency value, a fifteenth functional unit including instructions for execution by the computer to successively determine the metric between the displaced ordinate values of the frequency mask and the ordinate values of the frequency spectrum and a sixteenth functional unit including instructions for execution by the computer to allocate the last-determined ordinate values to the optimized ordinate values of the frequency mask.

34. The device according to claim 26, additionally comprising a seventeenth functional unit including instructions for execution by the computer to optimize the number of ordinate values of the frequency mask in the regions between the maxima and/or the minima.

35. A device for determining a frequency mask disposed above or below a frequency spectrum of a detected signal, the device comprising:

a computer;
an eighteenth functional unit including instructions for execution by the computer to select an ordinate value disposed at the left or right edge of the frequency spectrum as the first ordinate value of the frequency mask,
a nineteenth functional unit including instructions for execution by the computer to successively determine the respectively next ordinate value of the frequency mask, and
a twentieth functional unit including instructions for execution by the computer to generate the frequency mask disposed above or below the frequency spectrum of the detected signal by weighting the determined ordinate values of the frequency mask, wherein the characteristic points of the approximation function are selected from the group consisting of maximum, maximum with the deduction of a first threshold value, maximum with the deduction of a threshold value or respectively minimum, minimum with the deduction of a first threshold value, minimum with the deduction of a threshold value in the case of a parabolic or Gaussian approximation function, and four corner points of a trapeze-shaped approximation function.

36. The device according to claim 35, additionally comprising a seventh functional unit including instructions for execution by the computer to determine an optimized approximation function for the characteristic of ordinate values of the frequency mask in the environment of maxima or minima is provided, which contains an eighth functional unit including instructions for execution by the computer to identify maxima or minima of the ordinate values of the frequency mask, a ninth functional unit including instructions for execution by the computer to determine all ordinate values of the frequency mask in the environment of the respective local maximum or the respective local minimum and a tenth functional unit including instructions for execution by the computer to determine a function type and function parameters of the approximation function.

37. The device according to claim 36, wherein the seventh functional unit including instructions for execution by the computer to determine an optimized approximation function for the characteristic of the ordinate values of the frequency mask in the environment of maxima or minima contains an eleventh functional unit including instructions for execution by the computer to determine a reduced number of ordinate values of the approximation function at characteristic points of the approximation function.

38. The device according to claim 35, comprising a twelfth functional unit including instructions for execution by the computer to determine optimized ordinate values of the frequency mask in the right or left transitional region between the noise floor and a region adjacent to the noise floor of the frequency spectrum is provided, which contains a linear interpolator for the linear interpolation of the ordinate values of the frequency mask, a thirteenth functional unit including instructions for execution by the computer to determine a metric between the linear optimized ordinate values of the frequency mask and the ordinate values of the frequency spectrum, a fourteenth functional unit including instructions for execution by the computer to successively left or right displace the ordinate values of the frequency mask in each case by one sampled-frequency value, a fifteenth functional unit including instructions for execution by the computer to successively determine the metric between the displaced ordinate values of the frequency mask and the ordinate values of the frequency spectrum and a sixteenth functional unit including instructions for execution by the computer to allocate the last-determined ordinate values to the optimized ordinate values of the frequency mask.

39. The device according to claim 35, additionally comprising a seventeenth functional unit including instructions for execution by the computer to optimize the number of ordinate values of the frequency mask in the regions between the maxima and/or the minima.

\* \* \* \* \*